United States Patent
Li

(10) Patent No.: US 9,680,501 B1
(45) Date of Patent: Jun. 13, 2017

(54) DE-SERIALIZATION CIRCUIT AND METHOD OF OPERATING THE SAME

(71) Applicant: TAIWAN SEMICONDUCTOR MANUFACTURING COMPANY, LTD., Hsinchu (TW)

(72) Inventor: Shao-Yu Li, Hsinchu (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 15/133,447

(22) Filed: Apr. 20, 2016

(51) Int. Cl.
*H03M 9/00* (2006.01)
*H03K 3/037* (2006.01)
*H03K 21/02* (2006.01)

(52) U.S. Cl.
CPC .............. *H03M 9/00* (2013.01); *H03K 3/037* (2013.01); *H03K 21/026* (2013.01)

(58) Field of Classification Search
CPC . G01R 31/3177; G01R 31/3171; H03M 1/56; H03M 9/00; H03K 5/135; H03K 5/1515; H03K 19/0941; H03K 19/012; H03K 19/0013; H03K 19/0175; H03K 19/094; H03K 3/037; H03K 21/026
USPC ..... 341/100, 101; 327/199, 217; 326/82, 83, 326/87
See application file for complete search history.

(56) References Cited

U.S. PATENT DOCUMENTS

| | | | |
|---|---|---|---|
| 7,119,600 B2 | 10/2006 | Chen | |
| 7,310,057 B2* | 12/2007 | Murata et al. | ......... H03M 9/00 341/101 |
| 8,405,529 B2 | 3/2013 | Chang | |
| 8,410,818 B1 | 4/2013 | Hsu et al. | |
| 8,487,654 B1 | 7/2013 | Chen | |
| 2009/0060509 A1* | 3/2009 | Shimoosako et al. | H04J 3/1694 398/66 |
| 2009/0102692 A1* | 4/2009 | Pickering | ............ H03K 5/1515 341/155 |
| 2010/0106437 A1* | 4/2010 | Aboshi et al. | ....... H04B 10/073 702/63 |
| 2011/0285568 A1* | 11/2011 | Harpe | ..................... H03M 1/56 341/158 |
| 2014/0115409 A1* | 4/2014 | Miller | ................ G01R 31/3171 714/703 |

* cited by examiner

*Primary Examiner* — Lam T Mai
(74) *Attorney, Agent, or Firm* — Hauptman Ham, LLP

(57) ABSTRACT

A de-serialization circuit includes a clock generation circuit, a first and a second latch circuit. The clock generation circuit is configured to generate a set of phase clock signals based on a first clock signal and a control signal. Each phase clock signal of the set of phase clock signals being offset from adjacent phase clock signals of the set of phase clock signals by a phase value. The first latch circuit is configured to generate a first set of data signals based on the set of phase clock signals and an input data signal. The second latch circuit is configured to generate a second set of data signals based on a first phase clock signal of the set of phase clock signals and the first set of data signals. Each signal of the second set of data signals being aligned with each other, wherein the first clock signal is non-continuous.

20 Claims, 11 Drawing Sheets

DE-SERIALIZATION CIRCUIT AND METHOD OF OPERATING THE SAME

BACKGROUND

The semiconductor integrated circuit (IC) industry has produced a wide variety of digital devices to address issues in a number of different areas. As ICs have become smaller and more complex, clock operating frequencies of these digital devices continues to affect IC performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
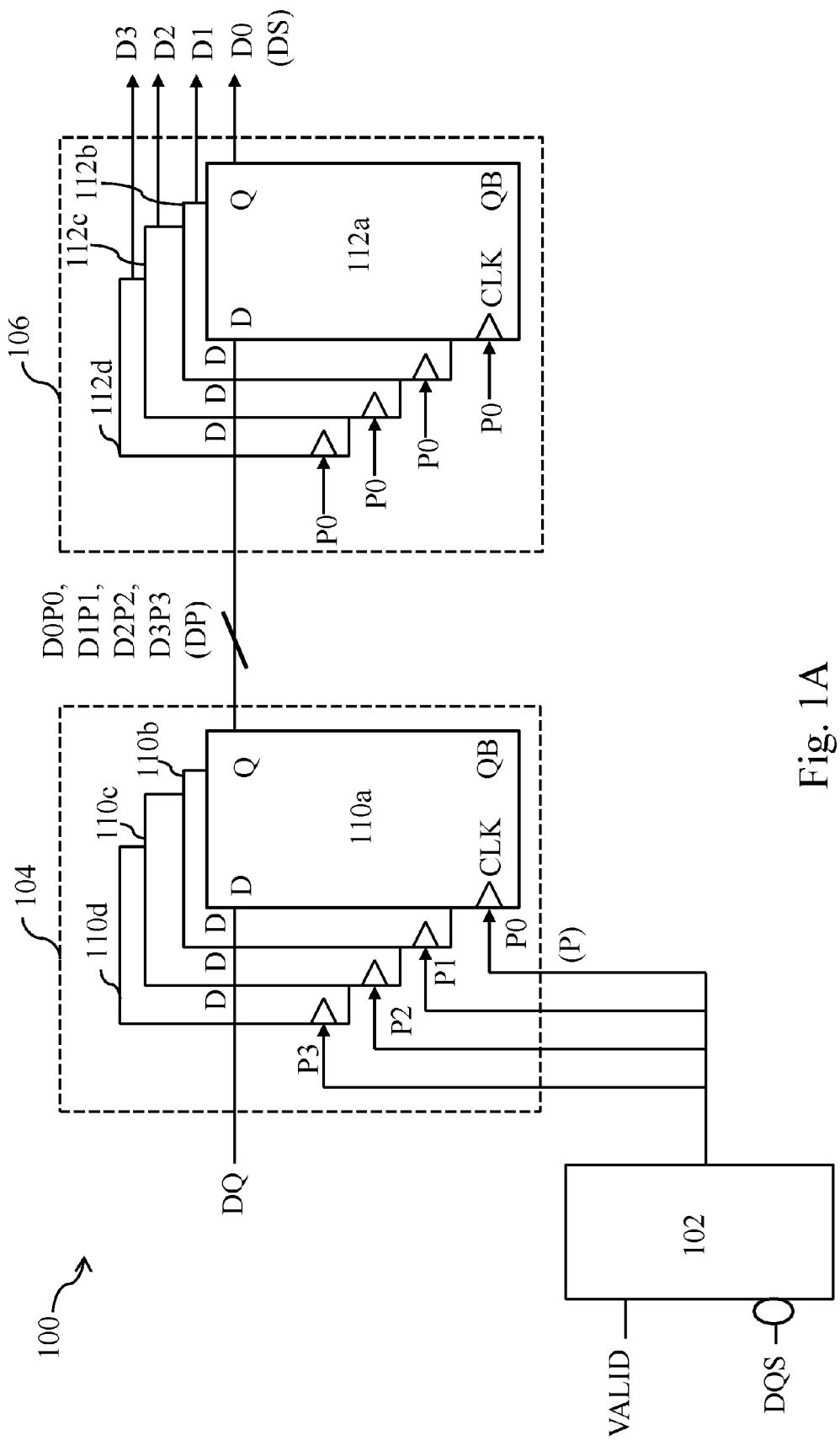
FIG. 1A is a block diagram of a de-serialization circuit, in accordance with some embodiments.

The following disclosure provides different embodiments, or examples, for implementing features of the provided subject matter. Specific examples of components and arrangements are described below to simplify the present disclosure. These are, of course, merely examples and are not limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a de-serialization circuit (e.g., a serial-to-parallel converter circuit) is configured to receive a serial stream of input data or an input data signal, and is configured to output a parallel data stream or a parallel set of data signals. In some embodiments, the de-serialization circuit includes a clock generation circuit, a first latch circuit and a second latch circuit. The clock generation circuit is configured to generate a set of phase clock signals based on a first clock signal and a control signal. In some embodiments, the first latch circuit is configured to generate a first set of data signals based on the set of phase clock signals and a serial data signal. In some embodiments, the second latch circuit is configured to generate a second set of data signals or a parallel set of data signals based on a first phase clock signal and the first set of data signals. Each signal of the parallel set of data signals is aligned with each other. In some embodiments, the first clock signal is non-continuous.

FIG. 1A is a block diagram of a de-serialization circuit 100, in accordance with some embodiments.

De-serialization circuit 100 includes a clock generation circuit 102, a first latch circuit 104 and a second latch circuit 106. Clock generation circuit 102 is coupled to first latch circuit 104. Second latch circuit 106 is coupled to first latch circuit 104. De-serialization circuit 100 is configured to receive a serial data stream (e.g., input data signal DQ), and is configured to convert the serial data stream (e.g., input data signal DQ) to a parallel data stream (e.g., second set of data signals D0, D1, D2, D3).

Clock generation circuit 102 is configured to receive a first clock signal DQS and a control signal VALID. Clock generation circuit 104 is configured to generate a set of phase clock signals P0, P1, P2 and P3 (collectively referred to as "set of phase clock signals P") based on first clock signal DQS and control signal VALID. Clock generation circuit 102 is a negative edge-triggered circuit. In some embodiments, clock generation circuit 102 is a positive edge-triggered circuit. First clock signal DQS is a reference clock signal that oscillates between logic high and logic low at a frequency $F_{DQS}$. In some embodiments, first clock signal DQS is a data strobe signal that identifies entries (e.g., time slots) within the data sequence of input data signal DQ. In some embodiments, the first clock signal DQS is stopped by an external circuit (not shown) such that is a non-continuous waveform. In some embodiments, the first clock signal DQS is not stopped by an external circuit (not shown) such that is a continuous waveform. A leading edge of input data signal DQ is offset from a leading edge of first clock signal DQS by a phase difference. In some embodiments, the leading edge of input data signal DQ is offset from the leading edge of first clock signal DQS by a phase difference of 90 degrees. Control signal VALID is a reference clock signal that oscillates between logic high and logic low at a frequency $F_{VALID}$. In some embodiments, control signal VALID is usable by de-serialization circuit 100 to indicate that input data signal DQ contains data that is to be converted from a serial data stream to a parallel data stream. Each phase clock signal of the set of phase clock signals P is offset from adjacent phase clock signals of the set of phase clock signals P by a phase value PV1. In some embodiments, phase value PV1 is 90 degrees. A leading edge of control signal VALID is synchronized with a leading edge of input data signal DQ. A trailing edge of control signal VALID is synchronized with a trailing edge of input data signal DQ.

First latch circuit 104 is configured to generate a first set of data signals D0P0, D1P1, D2P2 and D3P3 (collectively referred to as "first set of data signals DP") based on set of phase clock signals P and input data signal DQ. First latch circuit 104 is a positive edge-triggered circuit. In some embodiments, first latch circuit 104 is a negative edge-triggered circuit.

Second latch circuit 106 is configured to generate a second set of data signals D0, D1, D2 and D3 (collectively referred to as "second set of data signals DS") based on a first phase clock signal P0 of the set of phase clock signals P and first set of data signals DP. Second latch circuit 106 is a positive edge-triggered circuit. In some embodiments, second latch circuit 106 is a negative edge-triggered circuit. Each signal of the second set of data signals are aligned with each other such that a phase difference between each signal of the second set of data signals is substantially equal to 0 degrees.

First latch circuit 104 comprises a first set of flip-flops 110a, 110b, 110c and 110d (collectively referred to as "first set of flip-flops 110"). Each flip-flop of the first set of flip-flops 110 has a first input terminal D configured to receive input data signal DQ. Each flip-flop of the first set of flip-flops 110 has a second input terminal CLK configured to receive a corresponding phase clock signal of the set of phase clock signals P. Each flip-flop of the first set of flip-flops 110 has an output terminal Q configured to output a corresponding signal of the first set of data signals DP. Second input terminal CLK of each flip-flop of the first set of flip-flops 110 is coupled to a corresponding output terminal (not shown) of phase clock signal of the set of phase clock signals P.

Second latch circuit 106 comprises a second set of flip-flops 112a, 112b, 112c and 112d (collectively referred to as "second set of flip-flops 112"). Each flip-flop of the second set of flip-flops 112 corresponds to each flip-flop of the first set of flip-flops 110. Each flip-flop of the second set of flip-flops 112 has a third input terminal CLK configured to receive the first phase clock signal P0 of the set of phase clock signals P. Each flip-flop of the second set of flip-flops 112 has a fourth input terminal D coupled to the corresponding first output terminal Q of each flip-flop of the first set of flip-flops 110. The fourth input terminal D of each flip-flop of the second set of flip-flops 112 is configured to receive the corresponding signal of the first set of data signals DP. Each flip-flop of the second set of flip-flops 112 has a second output terminal Q configured to output a corresponding signal of the second set of data signals DS.

Input data signal DQ is a data sequence having a plurality of entries. Each phase clock signal of the set of phase clock signals P corresponds to each entry of the plurality of entries of the input data signal. Each signal of the first set of data signals DP corresponds to each phase clock signal of the set of phase clock signals P and each entry of the plurality of entries of the input data signal. Each signal of the second set of data signals DS corresponds to each signal of the first set of data signals DP. A period $T_P$ of each signal of the set of phase clock signals P is greater than a period $T_{DQ}$ of the input data signal DQ.

Figure 1B:
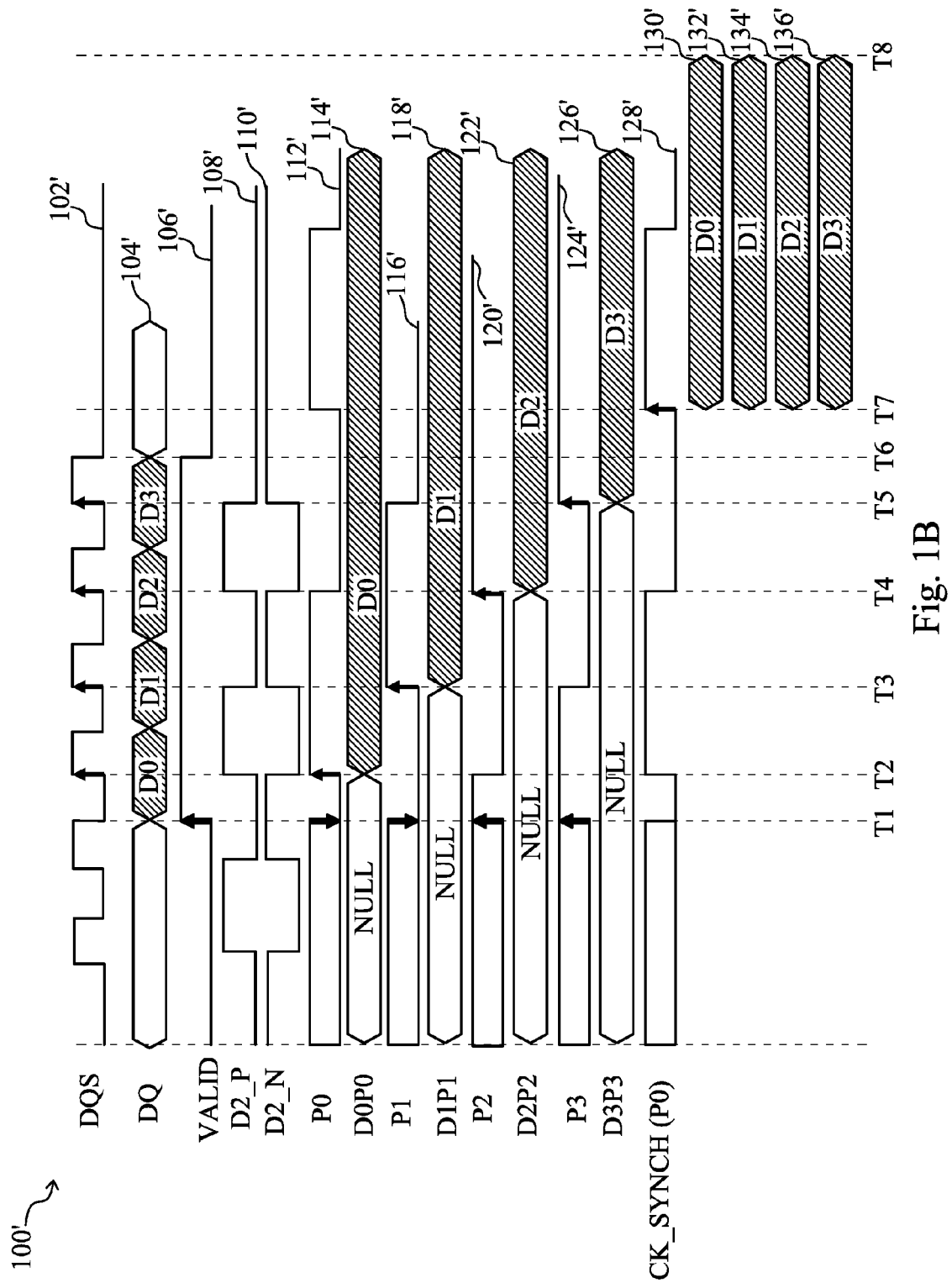
FIG. 1B is a timing diagram of waveforms generated by a de-serialization circuit, in accordance with some embodiments.

FIG. 1B is a timing diagram of waveforms generated by a de-serialization circuit, in accordance with some embodiments.

Curve 102' represents a first clock signal DQS; curve 104' represents input data signal DQ received by de-serialization circuit 100; curve 106' represents control signal VALID received by clock generating circuit 102; curve 108' represents a first divided clock signal D2_P (FIG. 3) generated by a first flip-flop 302 (FIG. 3); curve 110' represents a second divided clock signal D2_N (FIG. 3) generated by first flip-flop 302 (FIG. 3); curve 112' represents a first phase clock signal P0 of the set of phase clock signals P generated by clock generating circuit 102; curve 114' represents a first data signal D0P0 of the first set of data signals DP generated by first latch circuit 104; curve 116' represents a second phase clock signal P1 of the set of phase clock signals P generated by clock generating circuit 102; curve 118' represents a second data signal D1P1 of the first set of data signals DP generated by first latch circuit 104; curve 120' represents a third phase clock signal P2 of the set of phase clock signals P generated by clock generating circuit 102; curve 122' represents a third data signal D2P2 of the first set of data signals DP generated by first latch circuit 104; curve 124' represents a fourth phase clock signal P3 of the set of phase clock signals P generated by clock generating circuit 102; curve 126' represents a fourth data signal D3P3 of the first set of data signals DP generated by first latch circuit 104; curve 128' represents a clock synchronization signal CK_SYNCH used by the second latch circuit 106 as a clock synchronization signal; curve 130' represents a first data signal D0 of the second set of data signals DS generated by second latch 106; curve 132' represents a second data signal D1 of the second set of data signals DS generated by second latch 106; curve 134' represents a third data signal D2 of the second set of data signals DS generated by second latch 106; and curve 136' represents a fourth data signal D3 of the second set of data signals DS generated by second latch 106.

At time T1, curve 102' transitions from logically high to logically low, curve 104' transitions (e.g., the transition of curve 104' from logically low to logically high or vice versa depends on the actual value of the data) reflecting the presence of serial data, and curve 106' transitions from logically low to logically high in response to the transition of curve 104', thus causing first phase clock signal P0 (e.g., curve 112') of the set of phase clock signals P, second phase clock signal P1 (e.g., curve 116') of the set of phase clock signals P, third phase clock signal P2 (e.g., curve 118') of the set of phase clock signals P and fourth phase clock signal P3 (e.g., curve 122') of the set of phase clock signals P to be generated (at time T2, T3, T4 and T5) by clock generating circuit 102.

At time T2, curve 104' transitions from logically low to logically high in response to the transition by curve 106'. At time T2, curve 108' transitions from logically low to logically high in response to the transition by curve 104', and curve 110' transitions from logically high to logically low in response to the transition by curve 104'. In some embodiments, curve 102' is out of phase with curve 104' by 90 degrees. In some embodiments, curve 102' transitions from logically high to logically low at a time corresponding to a middle point of data D0, D1, D2 or D3.

At time T2, curve 112' transitions from logically low to logically high in response to curve 102' transitioning from logically low to logically high, thus causing flip-flop 110a (FIG. 1A) to hold data D0 of input data signal DQ (shown as curve 104'), and to output corresponding signal D0P0 (shown as curve 114'). At time T2, curve 120' transitions from logically high to logically low in response to curve 102' transitioning from logically low to logically high or curve 112' transitioning from logically low to logically high. At time T2, curve 128' transitions from logically low to logically high in response to curve 102' transitioning from logically low to logically high. In some embodiments, clock synchronization signal CK_SYNCH corresponds to the first phase clock signal P0 of the set of phase clock signals P generated by clock generating circuit 102.

At time T3, curve 116' transitions from logically low to logically high in response to curve 102' transitioning from logically low to logically high, thus causing flip-flop 110b (FIG. 1A) to hold data D1 of input data signal DQ (shown as curve 104'), and to output corresponding signal D1P1 (shown as curve 118'). At time T3, curve 124' transitions from logically high to logically low in response to curve 102' transitioning from logically low to logically high or curve 116' transitioning from logically low to logically high. At time T3, curve 110' transitions from logically low to logically high, and curve 108' transitions from logically high to logically low.

At time T4, curve 120' transitions from logically low to logically high in response to curve 102' transitioning from logically low to logically high, thus causing flip-flop 110c (FIG. 1A) to hold data D2 of input data signal DQ (shown as curve 104'), and to output corresponding signal D2P2 (shown as curve 122'). At time T4, curve 112' transitions from logically high to logically low in response to curve 102' transitioning from logically low to logically high or curve 120' transitioning from logically low to logically high. At time T4, curve 108' transitions from logically low to logically high, and curve 110' transitions from logically high to logically low. At time T4, curve 128' transitions from logically high to logically low in response to curve 112' transitioning from logically low to logically high.

At time T5, curve 124' transitions from logically low to logically high in response to curve 102' transitioning from logically low to logically high, thus causing flip-flop 110d (FIG. 1A) to hold data D3 of input data signal DQ (shown as curve 104'), and to output corresponding signal D3P3 (shown as curve 126'). At time T5, curve 116' transitions from logically high to logically low in response to curve 102' transitioning from logically low to logically high or curve 124' transitioning from logically low to logically high. At time T5, curve 110' transitions from logically low to logically high, and curve 108' transitions from logically high to logically low.

At time T6, curve 102' transitions from logically low to logically high, curve 104' transitions (e.g., the transition of curve 104' from logically low to logically high or vice versa depends on the actual value of the data) reflecting no presence of serial data, and curve 106' transitions from logically high to logically low in response to the transition of curve 104'.

At time T7, curve 128' transitions from logically low to logically high causing flip-flop 112a (FIG. 1A) to hold data D0P0 (shown as curve 114'), and to output corresponding signal D0 (shown as curve 130'). At time T7, curve 128' transitions from logically low to logically high causing flip-flop 112b (FIG. 1A) to hold data D1P1 (shown as curve 118'), and to output corresponding signal D1 (shown as curve 132'). At time T7, curve 128' transitions from logically low to logically high causing flip-flop 112c (FIG. 1A) to hold data D2P2 (shown as curve 122'), and to output corresponding signal D2 (shown as curve 134'). At time T7, curve 128' transitions from logically low to logically high causing flip-flop 112d (FIG. 1A) to hold data D3P3 (shown as curve 126'), and to output corresponding signal D3 (shown as curve 136'). A leading edge of each of curves 130', 132', 134' and 136 is aligned.

At time T8, each of curves 130', 132', 134' and 136 transition (e.g., the transition of curve 104' from logically low to logically high or vice versa depends on the actual value of the data). A trailing edge of each of curves 130', 132', 134' and 136 is aligned.

As shown in FIG. 1B, de-serialization circuit 100 or de-serialization circuit 600 (FIG. 6), are configured to receive serial data stream (e.g., input data signal DQ shown as curve 104') and to generate a plurality of parallel data streams (e.g., second set of data signals DS shown as curves 130', 132', 134' and 136').

Figure 2:
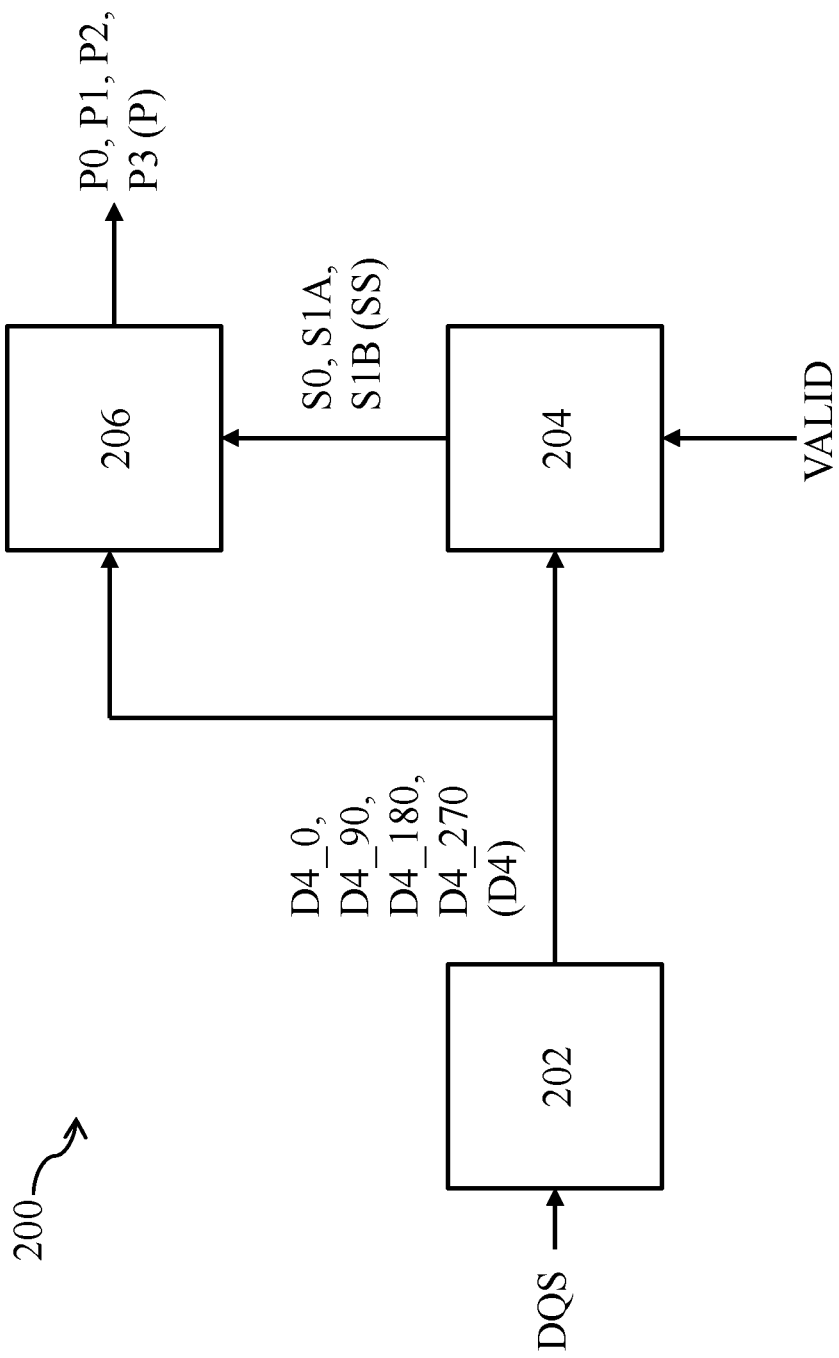
FIG. 2 is a block diagram of a clock generating circuit usable as the clock generation circuit in FIG. 1 or FIG. 6, in accordance with some embodiments.
Figure 6:
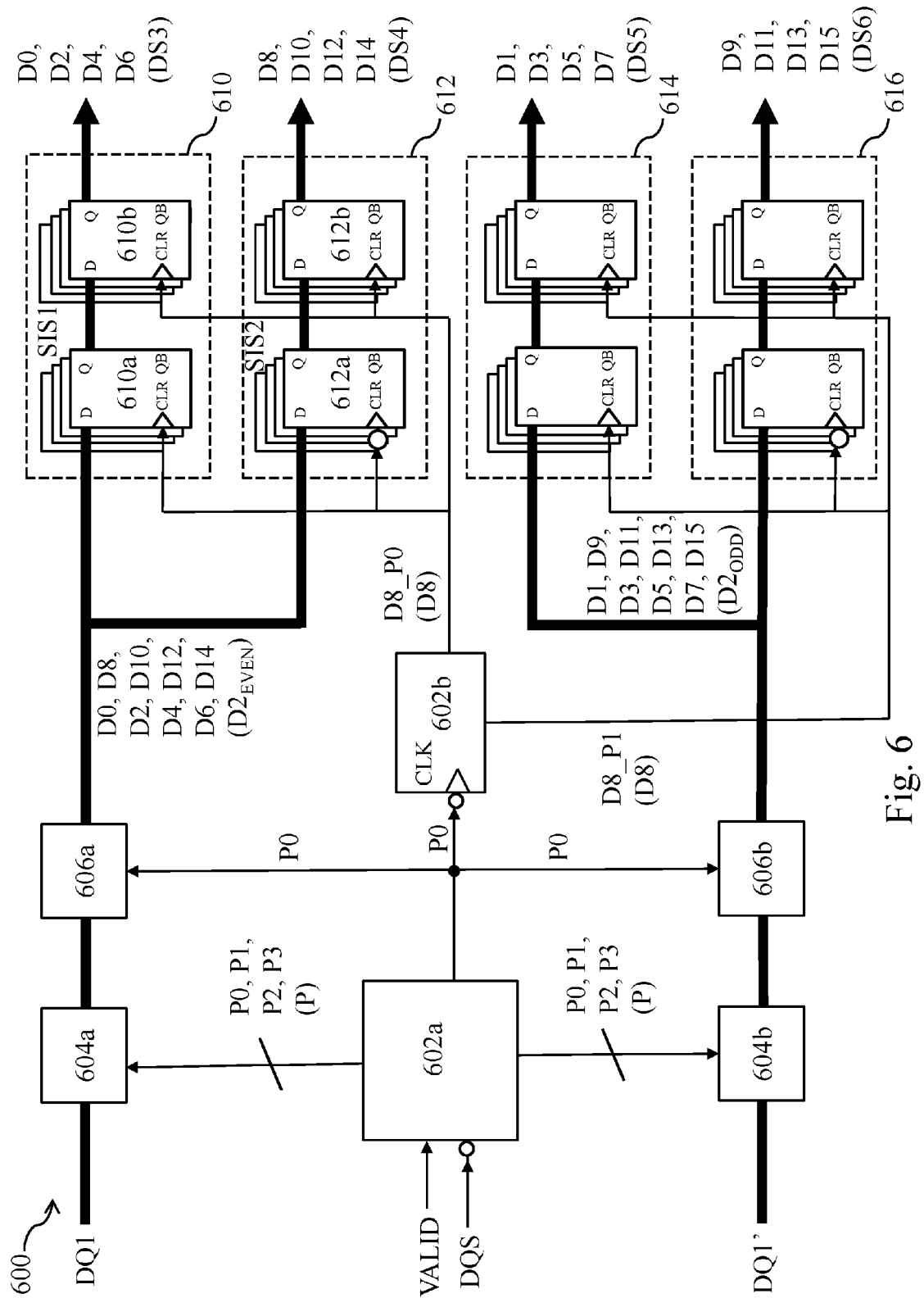
FIG. 6 is a block diagram of another de-serialization circuit, in accordance with some embodiments.

FIG. 2 is a block diagram of a clock generating circuit usable as the clock generation circuit in FIG. 1A or FIG. 6, in accordance with some embodiments.

Clock generation circuit 200 is usable as clock generation circuit 102 (FIG. 1 or 6). Clock generation circuit 200 comprises a frequency divider circuit 202, a first phase switching circuit 204 and a second phase switching circuit 206. Each of frequency divider circuit 202, first phase switching circuit 204 and second phase switching circuit 206 is coupled to each other. Frequency divider circuit 202 is configured to receive first clock signal DQS. Frequency divider circuit 202 is configured to generate a first set of intermediate phase clock signals D4_0, D4_90, D4_180 and D4_270 (collectively referred to as "first set of intermediate phase clock signals D4") based on first clock signal DQS. Each intermediate phase clock signal of the first set of intermediate phase clock signals D4 has a frequency $F_{DIV}$ less than a frequency of the first clock signal $F_{DQS}$. In some embodiments, frequency divider circuit 202 is a divide-by-four circuit. In some embodiments, frequency $F_{DIV}$ is $\frac{1}{4}^{th}$ of the frequency of the first clock signal $F_{DQS}$. Each intermediate phase clock signal of the first set of intermediate phase clock signals D4 is offset from an adjacent phase clock signal of the first set of intermediate phase clock signals D4 by 90 degrees.

First phase switching circuit 204 is configured to receive the first set of intermediate phase clock signals D4 and the control signal VALID. First phase switching circuit 204 is configured to generate a set of switching signals S0, S1A, and S1B (collectively referred to as "set of switching signals SS") based on the first set of intermediate phase clock signals D4 and the control signal VALID. In some embodiments, first phase switching circuit 204 is configured to detect the phase condition of the first set of intermediate phase clock signals D4 based on the control signal VALID.

Second phase switching circuit 206 is configured to receive the first set of intermediate phase clock signals D4 and the set of switching signals SS. Second phase switching circuit 206 is configured to generate the set of phase clock signals P based on the first set of intermediate phase clock signals D4 and the set of switching signals SS.

Figure 3:
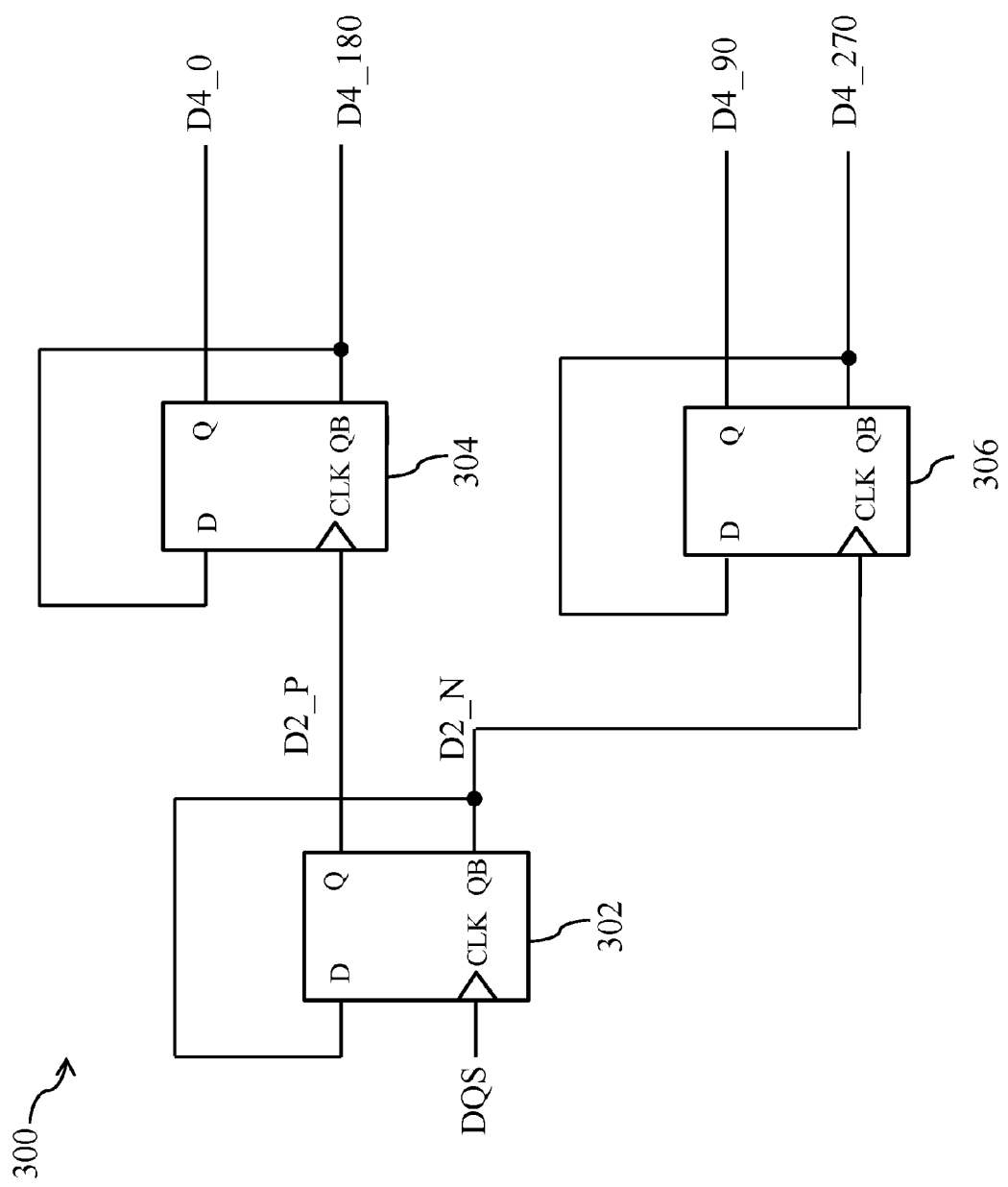
FIG. 3 is a circuit diagram of a frequency divider circuit usable in a clock generation circuit 102 of FIG. 1A in the de-serialization circuit 100, in accordance with some embodiments

FIG. 3 is a circuit diagram of a frequency divider circuit usable in a clock generation circuit 102 of FIG. 1A in the de-serialization circuit 100, in accordance with some embodiments. Frequency divider circuit 300 is usable in a clock generation circuit 102 of FIG. 6 in the de-serialization circuit 600. Frequency divider circuit 300 is usable as frequency divider circuit 202 (FIG. 2).

Frequency divider circuit 300 comprises a first flip-flop 302, a second flip-flop 304 and a third flip-flop 306. First flip-flop 302 is coupled to second flip-flop 304 and third flip-flop 306.

First flip-flop 302 is configured to generate a first divided clock signal D2_P and a second divided clock signal D2_N based on first clock signal DQS and a previous cycle of second divided clock signal D2_N. First flip-flop 302 has a first input terminal CLK, a second input terminal D, a first output terminal Q and a second output terminal QB. The first input terminal CLK of the first flip-flop 302 is configured to receive the first clock signal DQS. The second input terminal D of the first flip-flop 302 is coupled to the second output terminal QB of the first flip-flop 302. The first output terminal Q of the first flip-flop 302 is configured to generate a first divided clock signal D2_P. The second output terminal QB of the first flip-flop 302 is configured to generate a second divided clock signal D2_N. The second input terminal D of the first flip-flop 302 is configured to receive the second divided clock signal D2_N, as a feedback signal, from the second output terminal QB of the first flip-flop 302. First flip-flop 302 is configured as a divide-by-two circuit. First divided clock signal D2_P is inverted from second divided clock signal D2_N. First divided clock signal D2_P or second divided clock signal D2_N has a frequency $F_{DIV2}$. Frequency $F_{DIV2}$ is ½ of the frequency of the first clock signal $F_{DQS}$.

Second flip-flop 304 is configured to generate a third divided clock signal D4_0 and a fourth divided clock signal D4_180 based on first divided clock signal D2_P and a previous cycle of fourth divided clock signal D4_180. Second flip-flop 304 has a first input terminal CLK, a second input terminal D, a first output terminal Q and a second output terminal QB. The first input terminal CLK of the second flip-flop 304 is coupled to the first output terminal Q of the first flip-flop 302. The first input terminal CLK of the second flip-flop 304 is configured to receive the first divided clock signal D2_P. The second input terminal D of the second flip-flop 304 is coupled to the second output terminal QB of the second flip-flop 304. The first output terminal Q of the second flip-flop 304 is configured to generate a third divided clock signal D4_0. The second output terminal QB of the second flip-flop 304 is configured to generate a fourth divided clock signal D4_180. The second input terminal D of the second flip-flop 304 is configured to receive the fourth divided clock signal D4_180, as a feedback signal, from the second output terminal QB of the second flip-flop 304. Second flip-flop 304 is configured as a divide-by-two circuit. Third divided clock signal D4_0 is inverted from fourth divided clock signal D4_180. Third divided clock signal D4_0 or fourth divided clock signal D4_180 has a frequency $F_{DIV1A}$. Frequency $F_{DIV1A}$ is ½ of the frequency $F_{DIV}$. Frequency $F_{DIV1A}$ is ¼$^{th}$ of the frequency of the first clock signal $F_{DQS}$.

Third flip-flop 306 is configured to generate a fifth divided clock signal D4_90 and a sixth divided clock signal D4_270 based on second divided clock signal D2_N and a previous cycle of sixth divided clock signal D4_270. Third flip-flop 306 has a first input terminal CLK, a second input terminal D and a first output terminal Q and a second output terminal DQ. The first input terminal CLK of the third flip-flop 306 is coupled to the second output terminal QB of the first flip-flop 302. The first input terminal CLK of the third flip-flop 306 is configured to receive the second divided clock signal D2_N. The second input terminal D of the third flip-flop 306 is coupled to the second output terminal QB of the third flip-flop 306. The first output terminal Q of the third flip-flop 306 is configured to generate fifth divided clock signal D4_90. The second output terminal QB of the third flip-flop 306 is configured to generate sixth divided clock signal D4_270. The second input terminal D of the third flip-flop 306 is configured to receive the sixth divided clock signal D4_270, as a feedback signal, from the second output terminal QB of the third flip-flop 306. Third flip-flop 306 is configured as a divide-by-two circuit. Fifth divided clock signal D4_90 is inverted from sixth divided clock signal D4_270. Fifth divided clock signal D4_90 or sixth divided clock signal D4_270 has a frequency $F_{DIV1B}$. Frequency $F_{DIV1B}$ is ½ of the frequency $F_{DIV}$. Frequency $F_{DIV1B}$ is ¼$^{th}$ of the frequency of the first clock signal $F_{DQS}$. The third divided clock signal D4_0, the fourth divided clock signal D4_180, the fifth divided clock signal D4_90 and the sixth divided clock signal D4_270 belong to the first set of intermediate phase clock signals D4.

Figure 4:
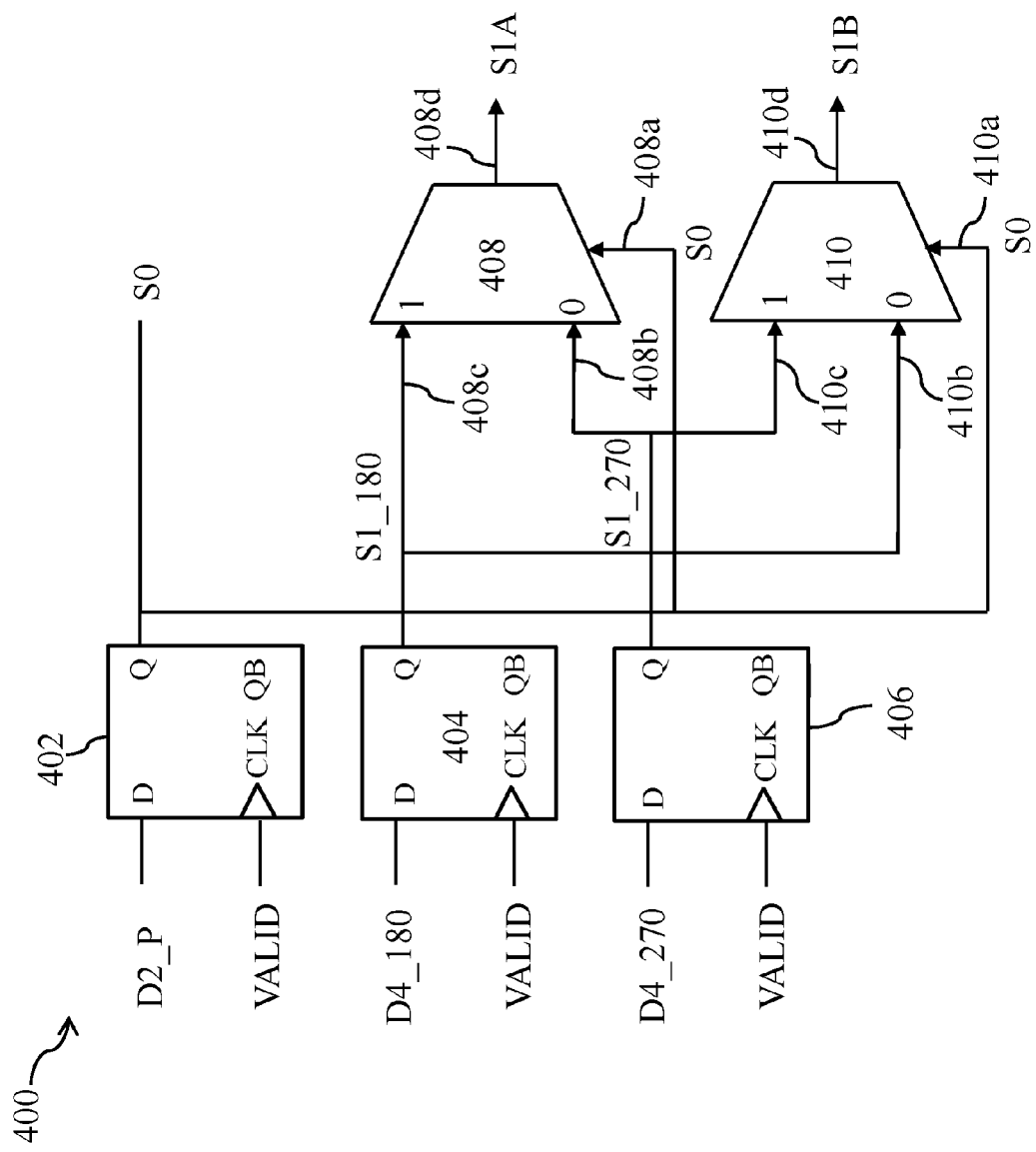
FIG. 4 is a circuit diagram of a first phase switching circuit usable in the clock generation circuit in FIG. 1A or FIG. 6, in accordance with some embodiments.

FIG. 4 is a circuit diagram of a first phase switching circuit usable in a clock generation circuit 102 of FIG. 1A, in accordance with some embodiments. First phase switching circuit 400 is usable in clock generation circuit 102 of FIG. 6 in the de-serialization circuit 600. First phase switching circuit 400 is usable as first phase switching circuit 204 (FIG. 2).

First phase switching circuit 400 comprises a fourth flip-flop 402, a fifth flip-flop 404, a sixth flip-flop 406, a first multiplexer 408 and a second multiplexer 410. Fourth flip-flop 402 is coupled to first multiplexer 408 and second multiplexer 410. Fifth flip-flop 404 is coupled to first multiplexer 408 and second multiplexer 410. Sixth flip-flop 406 is coupled to first multiplexer 408 and second multiplexer 410.

Fourth flip-flop 402 is configured to generate first switching signal S0 based on control signal VALID and first divided clock signal D2_P. Fourth flip-flop 402 has a first input terminal CLK, a second input terminal D, a first output terminal Q and a second output terminal QB. The first input terminal CLK of the fourth flip-flop 402 is configured to receive control signal VALID. In some embodiments, the second input terminal D of the fourth flip-flop 402 is coupled to the first output terminal Q of the first flip-flop 302 (FIG. 3). The second input terminal D of the fourth flip-flop 402 is configured to receive the first divided clock signal D2_P. The first output terminal Q of the fourth flip-flop 402 is configured to generate first switching signal S0.

Fifth flip-flop 404 is configured to generate a first intermediate switching signal S1_180 based on control signal VALID and fourth divided clock signal D4_180. Fifth flip-flop 404 has a first input terminal CLK, a second input terminal D, a first output terminal Q and a second output terminal QB. The first input terminal CLK of the fifth flip-flop 404 is configured to receive the control signal VALID. In some embodiments, the second input terminal D of the fifth flip-flop 404 is coupled to the second output terminal of the second flip-flop 304 (FIG. 3). The second input terminal D of the fifth flip-flop 404 is configured to receive the fourth divided clock signal D4_180. The first output terminal Q of the fifth flip-flop 404 is configured to generate first intermediate switching signal S1_180.

Sixth flip-flop 406 is configured to generate a second intermediate switching signal S1_270 based on control signal VALID and sixth divided clock signal D4_270. Sixth flip-flop 406 has a first input terminal CLK, a second input terminal D and a first output terminal Q and a second output terminal QB. The first input terminal CLK of the sixth flip-flop 406 is configured to receive the control signal VALID. In some embodiments, the second input terminal D of the sixth flip-flop 406 is coupled to the second output terminal QB of the third flip-flop 306 (FIG. 3). The second input terminal D of the sixth flip-flop 406 is configured to receive the sixth divided clock signal D4_270. The first output terminal Q of the sixth flip-flop 406 is configured to generate second intermediate switching signal S1_270.

First multiplexer 408 is configured to generate a second switching signal S1A based on the first switching signal S0, the first intermediate switching signal S1_180 and the second intermediate switching signal S1_270. First multiplexer 408 has a first input terminal 408a, a second input terminal 408b, a third input terminal 408c and a first output terminal 408d. The first input terminal 408a of the first multiplexer 408 is coupled to the first output terminal Q of the fourth flip-flop 402. The first input terminal 408a of the first multiplexer 408 is configured to receive the first switching signal S0. The second input terminal 408b of the first multiplexer 408 is coupled to the first output terminal Q of the sixth flip-flop 406. The second input terminal 408b of the first multiplexer 408 is configured to receive the second intermediate switching signal S1_270. The third input terminal 408c of the first multiplexer 408 is coupled to the first output terminal Q of the fifth flip-flop 404. The third input terminal 408c of the first multiplexer 408 is configured to receive the first intermediate switching signal S1_180. The first output terminal 408d of the first multiplexer 408 is configured to generate second switching signal S1A.

Second multiplexer 410 is configured to generate a third switching signal S1B based on the first switching signal S0, the first intermediate switching signal S1_180 and the second intermediate switching signal S1_270. Second multiplexer 410 has a first input terminal 410a, a second input terminal 410b, a third input terminal 410c and a first output terminal 410d. The first input terminal 410a of the second multimultiplexer 410 is coupled to the first output terminal Q of the fourth flip-flop 402. The first input terminal 410a of the second multiplexer 410 is configured to receive the first switching signal S0. The second input terminal 410b of the second multiplexer 410 is coupled to the first output terminal Q of the fifth flip-flop 404. The second input terminal 410b of the second multiplexer 410 is configured to receive the first intermediate switching signal S1_180. The third input terminal 410c of the second multiplexer 410 is coupled to the first output terminal Q of the sixth flip-flop 406. The third input terminal 410c of the second multiplexer 410 is configured to receive the second intermediate switching signal S1_270. The first output terminal 410d of the second multiplexer 410 is configured to generate the third switching signal S1B. The first switching signal S0, the second switching signal S1A and the third switching signal S1B belong to the set of switching signals SS.

Figure 5:
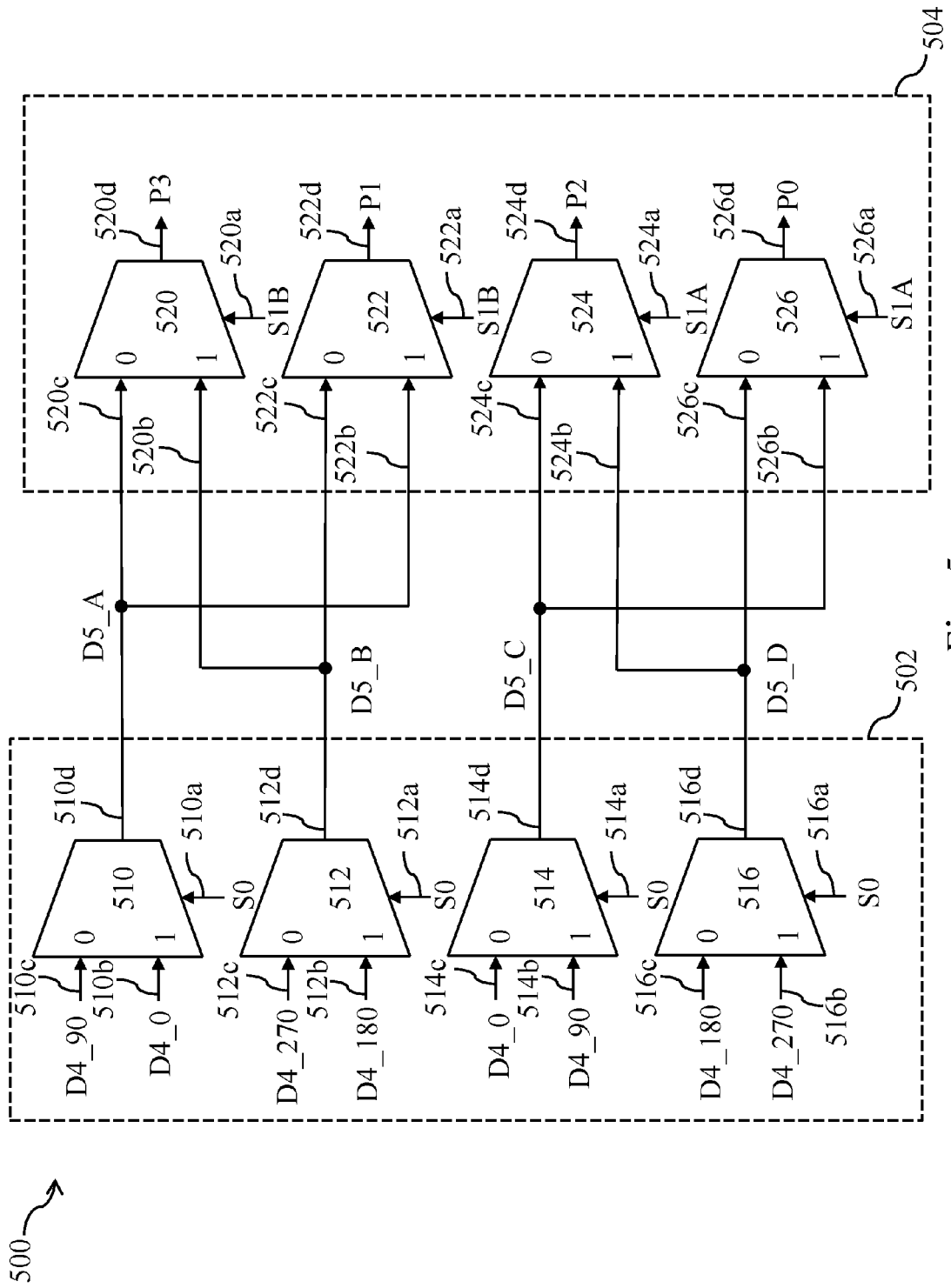
FIG. 5 is a circuit diagram of a second phase switching circuit usable in a clock generation circuit 102 of FIG. 1A, in accordance with some embodiments.

FIG. 5 is a circuit diagram of a second phase switching circuit usable in clock generation circuit 102 of FIG. 1A, in accordance with some embodiments. Second phase switching circuit 500 is usable in clock generation circuit 102 of FIG. 6 in the de-serialization circuit 600. Second phase switching circuit 500 is usable as second phase switching circuit 206 (FIG. 2).

Second phase switching circuit 500 comprises a first set of multiplexers 502 and a second set of multiplexers 504. The first set of multiplexers 502 is coupled to the second set of multiplexers 504.

The first set of multiplexers 502 is configured to generate a second set of intermediate phase clock signals D5_A, D5_B, D5_C and D5_D (collectively referred to as "second set of intermediate phase clock signals D5") based on the first switching signal S0, the third divided clock signal D4_0, the fourth divided clock signal D4_180, the fifth divided clock signal D4_90 and the sixth divided clock signal D4_270. In some embodiments, the third divided clock signal D4_0 is offset from the fifth divided clock signal D4_90 by 90 degrees. In some embodiments, the sixth divided clock signal D4_270 is offset from the fourth divided clock signal D4_180 by 90 degrees. The second set of intermediate phase clock signals D5 includes the third divided clock signal D4_0, the fourth divided clock signal D4_180, the fifth divided clock signal D4_90 and the sixth divided clock signal D4_270. In some embodiments, the first set of multiplexers 502 is configured to output the third divided clock signal D4_0, the fourth divided clock signal D4_180, the fifth divided clock signal D4_90 and the sixth divided clock signal D4_270 based on the first switching signal S0. In some embodiments, intermediate phase clock signal D5_A is offset from intermediate phase clock signal D5_B by 180 degrees. In some embodiments, intermediate phase clock signal D5_C is offset from intermediate phase clock signal D5_D by 180 degrees.

The second set of multiplexers 504 is configured to generate the set of phase clock signals P based on the second switching signal S1A, the third switching signal S1B and the second set of intermediate phase clock signals D5. In some embodiments, the second set of multiplexers 504 is configured to output the third divided clock signal D4_0, the fourth divided clock signal D4_180, the fifth divided clock signal D4_90 and the sixth divided clock signal D4_270 based on the second switching signal S1A and the third switching signal S1B. The third divided clock signal D4_0, the fourth divided clock signal D4_180, the fifth divided clock signal D4_90 and the sixth divided clock signal D4_270 belong to the set of phase clock signals P.

The first set of multiplexers 502 comprises a first multiplexer 510, a second multiplexer 512, a third multiplexer 514 and a fourth multiplexer 516.

First multiplexer 510 is configured to generate a first intermediate phase clock signal D5_A of the second set of intermediate phase clock signals D5 based on the first switching signal S0, the third divided clock signal D4_0 and the fifth divided clock signal D4_90. First multiplexer 510 has a first input terminal 510a, a second input terminal 510b, a third input terminal 510c and a first output terminal 510d. The first input terminal 510a of the first multiplexer 510 is configured to receive the first switching signal S0. In some embodiments, the first input terminal 510a of the first multiplexer 510 is coupled to the first phase switching circuit 400 (e.g., by the first output terminal Q of the fourth flip-flop 402 (FIG. 4)). The second input terminal 510b of the first multiplexer 510 is configured to receive the third divided clock signal D4_0. In some embodiments, the second input terminal 510b of the first multiplexer 510 is coupled to the frequency divider circuit 300 (e.g., by the first output terminal Q of the second flip-flop 304 (FIG. 3)). The third input terminal 510c of the first multiplexer 510 is configured to receive the fifth divided clock signal D4_90.

In some embodiments, the third input terminal 510c of the first multiplexer 510 is coupled to the frequency divider circuit 300 (e.g., by the first output terminal Q of the third flip-flop 306 (FIG. 3)). The first output terminal 510d of the first multiplexer 510 is configured to generate a first intermediate phase clock signal D5_A of the second set of intermediate phase clock signals D5. First intermediate phase clock signal D5_A of the second set of intermediate phase clock signals D5 includes the third divided clock signal D4_0 or the fifth divided clock signal D4_90.

Second multiplexer 512 is configured to generate a second intermediate phase clock signal D5_B of the second set of intermediate phase clock signals D5 based on the first switching signal S0, the sixth divided clock signal D4_270 and the fourth divided clock signal D4_180.

Second multiplexer 512 has a first input terminal 512a, a second input terminal 512b, a third input terminal 512c and a first output terminal 512d. The first input terminal 512a of the second multiplexer 512 is configured to receive the first switching signal S0. In some embodiments, the first input terminal 512a of the second multiplexer 512 is coupled to the first phase switching circuit 400 (e.g., by the first output terminal Q of the fourth flip-flop 402 (FIG. 4)). The second input terminal 512b of the second multiplexer 512 is configured to receive the fourth divided clock signal D4_180. In some embodiments, the second input terminal 512b of the second multiplexer 512 is coupled to the frequency divider circuit 300 (e.g., by the second output terminal QB of the second flip-flop 304 (FIG. 3)). The third input terminal 512c of the second multiplexer 512 is configured to receive the sixth divided clock signal D4_270. In some embodiments, the third input terminal 512c of the second multiplexer 512 is coupled to the frequency divider circuit 300 (e.g., by the second output terminal QB of the third flip-flop 306 (FIG. 3)). The first output terminal 512d of the second multiplexer 512 is configured to generate a second intermediate phase clock signal D5_B of the second set of intermediate phase clock signals D5. Second intermediate phase clock signal D5_B of the second set of intermediate phase clock signals D5 includes the fourth divided clock signal D4_180 or the sixth divided clock signal D4_270.

Third multiplexer 512 is configured to generate a third intermediate phase clock signal D5_C of the second set of intermediate phase clock signals D5 based on the first switching signal S0, the third divided clock signal D4_0 and the fifth divided clock signal D4_90. Third multiplexer 514 comprises features similar to that of first multiplexer 510. Third multiplexer 514 differs from first multiplexer 510 in that a second terminal 514b of third multiplexer 514 is configured to receive fifth divided clock signal D4_90, a third terminal 514c of third multiplexer 514 is configured to receive third divided clock signal D4_0, and a first output terminal 514d of the third multiplexer 514 is configured to generate the third intermediate phase clock signal D5_C of the second set of intermediate phase clock signals D5. Third intermediate phase clock signal D5_C of the second set of intermediate phase clock signals D5 includes the third divided clock signal D4_0 or the fifth divided clock signal D4_90.

Fourth multiplexer 516 is configured to generate a fourth intermediate phase clock signal D5_D of the second set of intermediate phase clock signals D5 based on the first switching signal S0, the fourth divided clock signal D4_180 or the sixth divided clock signal D4_270. Fourth multiplexer 516 comprises features similar to that of second multiplexer 512. Fourth multiplexer 516 differs from second multiplexer 512 in that a second terminal 516b of fourth multiplexer 516 is configured to receive sixth divided clock signal D4_270, a third terminal 516c of fourth multiplexer 516 is configured to receive fourth divided clock signal D4_180, and a first output terminal 516d of the fourth multiplexer 516 is configured to generate the fourth intermediate phase clock signal D5_D of the second set of intermediate phase clock signals D5. Fourth intermediate phase clock signal D5_D of the second set of intermediate phase clock signals D5 includes the fourth divided clock signal D4_180 or the sixth divided clock signal D4_270.

The second set of multiplexers 504 comprises a fifth multiplexer 520, a sixth multiplexer 522, a seventh multiplexer 524 and an eighth multiplexer 526.

Fifth multiplexer 520 is configured to generate a fourth phase clock signal P3 of the set of phase clock signals P based on the third switching signal S1B, the first intermediate phase clock signal D5_A of the second set of intermediate phase clock signals D5 and the second intermediate phase clock signal D5_B of the second set of intermediate phase clock signals D5.

Fifth multiplexer 520 has a first input terminal 510a, a second input terminal 510b, a third input terminal 510c and a first output terminal 510d. The first input terminal 520a of the fifth multiplexer 520 is configured to receive the third switching signal S1B. In some embodiments, the first input terminal 520a of the fifth multiplexer 520 is coupled to the first phase switching circuit 400 (e.g., by the first output terminal 410d of the second multiplexer 410 (FIG. 4)). The second input terminal 520b of the fifth multiplexer 520 is configured to receive the second intermediate phase clock signal D5_B of the second set of intermediate phase clock signals D5. The second input terminal 520b of the fifth multiplexer 520 is coupled to the first output terminal 512d of the second multiplexer 512. The third input terminal 520c of the fifth multiplexer 520 is configured to receive the first intermediate phase clock signal D5_A of the second set of intermediate phase clock signals D5. The third input terminal 520c of the fifth multiplexer 520 is coupled to the first output terminal 510d of the first multiplexer 510. The first output terminal 520d of the fifth multiplexer 520 is configured to generate fourth phase clock signal P3 of the set of phase clock signals P.

Sixth multiplexer 522 is configured to generate a second phase clock signal P1 of the set of phase clock signals P based on the third switching signal S1B, the first intermediate phase clock signal D5_A of the second set of intermediate phase clock signals D5 and the second intermediate phase clock signal D5_B of the second set of intermediate phase clock signals D5.

Sixth multiplexer 522 comprises features similar to that of fifth multiplexer 520. Sixth multiplexer 522 differs from fifth multiplexer 520 in that a second terminal 522b of sixth multiplexer 522 is configured to receive first intermediate phase clock signal D5_A of the second set of intermediate phase clock signals D5, the second input terminal 522b of the sixth multiplexer 522 is coupled to the first output terminal 510d of the first multiplexer 510, a third terminal 522c of sixth multiplexer 522 is configured to receive second intermediate phase clock signal D5_B of the second set of intermediate phase clock signals D5, the third input terminal 522c of the sixth multiplexer 522 is coupled to the first output terminal 512d of the second multiplexer 512 and a first output terminal 522d of the sixth multiplexer 522 is configured to generate the second phase clock signal P1 of the set of phase clock signals P.

Seventh multiplexer 524 is configured to generate a third phase clock signal P2 of the set of phase clock signals P based on the second switching signal S1A, the third intermediate phase clock signal D5_C of the second set of intermediate phase clock signals D5 and the fourth intermediate phase clock signal D5_D of the second set of intermediate phase clock signals D5.

Seventh multiplexer 524 comprises features similar to that of fifth multiplexer 520. Seventh multiplexer 524 differs from fifth multiplexer 520 in that a first terminal 524a of seventh multiplexer 524 is configured to receive second switching signal S1A, a second terminal 524b of seventh multiplexer 524 is configured to receive fourth intermediate phase clock signal D5_D of the second set of intermediate phase clock signals D5, the second input terminal 524b of the seventh multiplexer 524 is coupled to the first output terminal 516d of the fourth multiplexer 516, a third terminal 524c of seventh multiplexer 524 is configured to receive third intermediate phase clock signal D5_C of the second set of intermediate phase clock signals D5, the third input terminal 524c of the seventh multiplexer 524 is coupled to the first output terminal 514d of the third multiplexer 514 and a first output terminal 524d of the seventh multiplexer 524 is configured to generate the third phase clock signal P2 of the set of phase clock signals P.

Eighth multiplexer 526 is configured to generate a first phase clock signal P0 of the set of phase clock signals P based on the second switching signal S1A, the third intermediate phase clock signal D5_C of the second set of intermediate phase clock signals D5 and the fourth intermediate phase clock signal D5_D of the second set of intermediate phase clock signals D5.

Eighth multiplexer 526 comprises features similar to that of seventh multiplexer 524. Eighth multiplexer 526 differs from seventh multiplexer 524 in that a second terminal 526b of eighth multiplexer 526 is configured to receive third intermediate phase clock signal D5_C of the second set of intermediate phase clock signals D5, the second input terminal 526b of the eighth multiplexer 526 is coupled to the first output terminal 514d of the third multiplexer 514, a third terminal 526c of eighth multiplexer 526 is configured to receive fourth intermediate phase clock signal D5_D of the second set of intermediate phase clock signals D5, the third input terminal 526c of the eighth multiplexer 526 is coupled to the first output terminal 516d of the fourth multiplexer 516, and a first output terminal 526d of the eighth multiplexer 526 is configured to generate the first phase clock signal P0 of the set of phase clock signals P.

In some embodiments, each multiplexer (e.g., first multiplexer 510, second multiplexer 512, third multiplexer 514 or fourth multiplexer 516) of the first set of multiplexers 502 is configured to receive a pair of signals (e.g., two signals from the group consisting of third divided clock signal D4_0, fourth divided clock signal D4_180, fifth divided clock signal D4_90 or sixth divided clock signal D4_270) that are 90 degrees offset from each other, and to output a signal (e.g., second set of intermediate phase clock signals D5_A, D5_B, D5_C or D5_D) of the pair of signals based on a switching signal (e.g., first switching signal S0).

In some embodiments, each multiplexer (e.g., fifth multiplexer 520, sixth multiplexer 522, seventh multiplexer 524 and eighth multiplexer 526) of the second set of multiplexers 504 is configured to receive a second pair of signals (e.g., two signals from the group consisting of first intermediate phase clock signal D5_A, second intermediate phase clock signal D5_B, third intermediate phase clock signal D5_C, or fourth intermediate phase clock signal D5_D) that are 180 degrees offset from each other, and to output a second signal (e.g., set of phase clock signals P) based on a switching signal (e.g., second switching signal S1A or third switching signal S1B).

FIG. 6 is a block diagram of another de-serialization circuit 600, in accordance with some embodiments. De-serialization circuit 600 is an embodiment of de-serialization circuit 100 (FIG. 1A). Components that are the same or similar to those in FIG. 1A are given the same reference numbers, and detailed description thereof is thus omitted.

In comparison with FIG. 1A, de-serialization circuit 600 is configured to receive a serial stream of data (e.g., input data signal DQ'). In some embodiments, serial stream of data (e.g., input data signal DQ') contains 16 data entries (e.g., D0, D1, D2, D3 . . . D14, D15). De-serialization circuit 600 is configured to output a parallel stream of data (e.g., a third set of data signals D0, D2, D4 and D6; a fourth set of data signals D8, D10, D12 and D14; a fifth set of data signals D1, D3, D5 and D7; and a sixth set of data signals D9, D11, D13 and D15).

Input data signal DQ' includes a first data signal DQ1 and a second data signal DQ1'. First data signal DQ1 contains even entries (D0, D2 . . . , and D14) within input data signal DQ'. Second data signal DQ1' contains odd entries (D1, D3 . . . , and D15) within input data signal DQ'. First data signal DQ1 is an embodiment of input data signal DQ. Second data signal DQ1' is an embodiment of input data signal DQ.

De-serialization circuit 600 includes a first clock generation circuit 602a, a second clock generation circuit 602b, first latch circuit 604a and 604b, second latch circuit 606a and 606b, third latch circuit 610, fourth latch circuit 612, fifth latch circuit 614 and sixth latch circuit 616.

First latch circuit 604a, second latch circuit 606a, third latch circuit 610 and fourth latch circuit 612 are configured to convert the even entries (D0, D2 . . . , and D14) of input data signal DQ' to a parallel data stream by processing the first data signal DQ1. First latch circuit 604b, second latch circuit 606b, fifth latch circuit 614 and sixth latch circuit 616 are configured to convert the odd entries (D1, D3 . . . , and D13) of input data signal DQ' to a parallel data stream by processing the second data signal DQ1'.

First latch circuit 604a and 604b are embodiments of first latch circuit 104. Second latch circuit 606a and 606b are embodiments of second latch circuit 106. First latch circuit 604a and 604b comprise features similar to that of first latch circuit 104. Second latch circuit 606a and 606b comprise features similar to that of second latch circuit 106. First latch circuit 604a differs from first latch circuit 104 in that first data signal DQ1 includes 8 entries of data (e.g., D0, D2 . . . , and D14). First latch circuit 604b differs from first latch circuit 104 in that second data signal DQ1' includes 8 entries of data (e.g., D1, D3 . . . , and D15).

Second latch circuit 606a differs from second latch circuit 106 in that the second set of data signals $D2_{EVEN}$ includes 8 entries of data (e.g., D0, D2 . . . , and D14). Second latch circuit 606b differs from second latch circuit 106 in that the second set of data signals $D2_{ODD}$ includes 8 entries of data (e.g., D1, D3 . . . , and D15).

First clock generation circuit 602a is an embodiment of clock generation circuit 102. First clock generation circuit 602a differs from clock generation circuit 102 in that first clock generation circuit 602a is configured to output the first phase clock signal P0 of the set of phase clock signals P to a second clock generation circuit 602b.

Second clock generation circuit 602b is coupled to first clock generation circuit 602a, third latch circuit 610, fourth latch circuit 612, fifth latch circuit 614 and sixth latch circuit 616. Second clock generation circuit 602b is configured to generate a second set of phase clock signals D8_P0, D8_P1 (collectively referred to as "second set of phase clock signals D8") based on the first phase clock signal P0 of the first set of phase clock signals P. Second clock generation circuit 602b is configured to output signal D8_P0 of the second set of phase clock signals D8 to third latch circuit 610 and fourth latch circuit 612. Second clock generation circuit 602b is configured to output signal D8_P1 of the second set of phase clock signals D8 to fifth latch circuit 614 and sixth latch circuit 616. Each phase clock signal of the second set of phase clock signals D8 are offset from adjacent phase clock signals of the second set of phase clock signals by a second phase value. Second clock generation circuit 602b is an embodiment of clock generation circuit 102. Second clock generation circuit 602b is a frequency divider circuit. In some embodiments, second clock generation circuit 602b is divide-by-two circuit. In some embodiments, second clock generation circuit 602b comprises features similar to first flip-flop 302 (FIG. 3). In some embodiments, second clock generation circuit 602b differs from first flip-flop 302 (FIG. 3) in that a first terminal CLK of second clock generation circuit 602b is configured to receive and use first phase clock signal P0 of the set of phase clock signals P as a clock signal. Second clock generation circuit 602b is a negative edge-triggered circuit. In some embodiments, second clock generation circuit 602b is a positive edge-triggered circuit.

Third latch circuit 610 is coupled to second latch circuit 606a and second clock generation circuit 602b. Third latch circuit 610 is configured to generate a third set of data signals D0, D2, D4 and D6 (collectively referred to as "third set of data signals D53") based on the first phase clock signal D8_P0 of the second set of phase clock signals D8 and the second set of data signals $D2_{EVEN}$.

Fourth latch circuit 612 is coupled to second latch circuit 606a and second clock generation circuit 602b. Fourth latch circuit 612 is configured to generate a fourth set of data signals D8, D10, D12 and D14 (collectively referred to as "fourth set of data signals D54") based on the first phase clock signal D8_P0 of the second set of phase clock signals D8 and the second set of data signals $D2_{EVEN}$. Each signal of the second set of data signals $D2_{EVEN}$ corresponds to each signal of the third set of data signals DS3 and each signal of the fourth set of data signals DS4.

Fifth latch circuit 614 comprises features similar to that of third latch circuit 610. Fifth latch circuit 614 differs from third latch circuit 610 in that fifth latch circuit 614 is coupled to second latch circuit 606b, fifth latch circuit 614 is configured to generate a fifth set of data signals D1, D3, D5 and D7 (collectively referred to as "fifth set of data signals DS5") based on a second phase clock signal D8_P1 of the second set of phase clock signals D8 and the second set of data signals $D2_{ODD}$.

Sixth latch circuit 616 comprises features similar to that of fourth latch circuit 612. Sixth latch circuit 616 differs from fourth latch circuit 612 in that sixth latch circuit 616 is coupled to second latch circuit 606b, sixth latch circuit 616 is configured to generate a sixth set of data signals D9, D11, D13 and D15 (collectively referred to as "sixth set of data signals DS6") based on the second phase clock signal D8_P1 of the second set of phase clock signals D8 and the second set of data signals $D2_{ODD}$. Each signal of the second set of data signals $D2_{ODD}$ corresponds to each signal of the fifth set of data signals DS5 and each signal of the sixth set of data signals DS6.

A leading edge of a signal of the third set of data signals DS3, the fourth set of data signals DS4, the fifth set of data signals DS5, and the sixth set of data signals DS6 is aligned with a leading edge of another signal of the third set of data signals DS3, the fourth set of data signals DS4, the fifth set of data signals DS5, and the sixth set of data signals DS6. A trailing edge of a signal of the third set of data signals DS3, the fourth set of data signals DS4, the fifth set of data signals DS5, and the sixth set of data signals DS6 is aligned with a trailing edge of another signal of the third set of data signals DS3, the fourth set of data signals DS4, the fifth set of data signals DS5, and the sixth set of data signals DS6. In some embodiments, each signal of the third set of data signals DS3, each signal of the fourth set of data signals DS4, each signal of the fifth set of data signals DS5, and each signal of the sixth set of data signals DS6 are aligned with each other. A leading edge of first data signal DQ1 or a leading edge of second data signal DQ1' is offset from a leading edge of first clock signal DQS by a phase difference. In some embodiments, the leading edge of first data signal DQ1 or a leading edge of second data signal DQ1' is offset from the leading edge of first clock signal DQS by a phase difference of 90 degrees.

Third latch circuit 610 comprises a first set of flip-flops 610a and a second set of flip-flops 610b. Each flip-flop of the second set 610b of flip-flops corresponds to each flip-flop of the first set of flip-flops 610a. Each flip-flop of the second set of flip-flops 610b has an input terminal D coupled to the corresponding output terminal Q of each flip-flop of the first set of flip-flops 610a.

First set of flip-flops 610a comprises features similar to that of the second set of flip-flops 112 (FIG. 1A). First set of flip-flops 610a differs from the second set of flip-flops 112 (FIG. 1A) in that each flip-flop of the first set of flip-flops 610a has a first input terminal CLK configured to receive the first phase clock signal D8_P0 of the second set of phase clock signals D8, each flip-flop of the first set of flip-flops 610a has a second input terminal D configured to receive corresponding signals of the second set of data signals $D2_{EVEN}$, and each flip-flop of the first set of flip-flops 610a has a first output terminal D configured to output a corresponding signal of a second intermediate set of data signals SIS1.

Second set of flip-flops 610b comprises features similar to that of the first set of flip-flops 610a. Second set of flip-flops 610b differs from the first set of flip-flops 610a in that each flip-flop of the second set of flip-flops 610b has a second input terminal D configured to receive corresponding signals of the second intermediate set of data signals SIS1, and each flip-flop of the second set of flip-flops 610b has a first output terminal D configured to output a corresponding signal of the third set of data signals DS3.

Fourth latch circuit 612 comprises a first set of flip-flops 612a and a second set of flip-flops 612b. Each flip-flop of the second set 612b of flip-flops corresponds to each flip-flop of the first set of flip-flops 612a. Each flip-flop of the second set of flip-flops 612b has an input terminal D coupled to the corresponding output terminal Q of each flip-flop of the first set of flip-flops 612a.

First set of flip-flops 612a comprises features similar to that of the first set of flip-flops 610a. First set of flip-flops 612a differs from the first set of flip-flops 610a in that each flip-flop of the first set of flip-flops 612a has a first input terminal CLK configured as a negative-edge triggered circuit, and each flip-flop of the first set of flip-flops 612a has a first output terminal D configured to output a corresponding signal of a second intermediate set of data signals SIS2.

Second set of flip-flops 612b comprises features similar to that of the second set of flip-flops 610b. Second set of flip-flops 612b differs from the second set of flip-flops 610b in that each flip-flop of the second set of flip-flops 612b has a second input terminal D configured to receive corresponding signals of the second intermediate set of data signals SIS2, and each flip-flop of the second set of flip-flops 612b has a first output terminal D configured to output a corresponding signal of the fourth set of data signals DS4.

De-serialization circuit 600 is configured to be utilized with a continuous or discontinuous data strobe signal (e.g., first clock signal DQS). De-serialization circuit 100 (FIG. 1A) or de-serialization circuit 600 (FIG. 6) has a higher de-serialization factor than other de-serialization circuits (not utilizing the features of de-serialization circuit 100 or de-serialization circuit 600). In some embodiments, de-serialization circuit 100 has a de-serialization factor of 1:4. In some embodiments, de-serialization circuit 600 has a de-serialization factor of 1:8.

De-serialization circuit 100 (FIG. 1A) or de-serialization circuit 600 (FIG. 6) has less latency than other de-serialization circuits (not utilizing the features of de-serialization circuit 100 or de-serialization circuit 600). For example, by utilizing clock generating circuit 102 or clock generating circuit 200 with a larger de-serialization factor than other de-serialization circuits, less serial to parallel conversions are performed resulting in less latency by de-serialization circuit 100 or de-serialization circuit 600 (FIG. 6).

De-serialization circuit 100 (FIG. 1A) or de-serialization circuit 600 (FIG. 6) consumes less power than other de-serialization circuits (not utilizing the features of de-serialization circuit 100 or de-serialization circuit 600). In some embodiments, de-serialization circuit 100 or de-serialization circuit 600 (FIG. 6) is configured to be utilized with a discontinuous or stopped data strobe signal (e.g., first clock signal DQS (FIGS. 1A-6) resulting in less power consumption than other de-serialization circuits.

De-serialization circuit 100 (FIG. 1A) or de-serialization circuit 600 (FIG. 6), when initialized, is configured to be reset less than other de-serialization circuits (not utilizing the features of de-serialization circuit 100 or de-serialization circuit 600).

De-serialization circuit 100 (FIG. 1A) or de-serialization circuit 600 (FIG. 6) do not have a phase ordering training sequence, while other de-serialization circuits utilize phase ordering training sequences.

De-serialization circuit 100 (FIG. 1A) or de-serialization circuit 600 (FIG. 6) has a more flexible phase ordering than other de-serialization circuits (not utilizing the features of de-serialization circuit 100 or de-serialization circuit 600).

Other configurations of the logic for first phase swapping circuit 204 or second phase swapping circuit 206 are within the contemplated scope of the present disclosure. For example, by changing the logic of first phase swapping circuit 204 or second phase swapping circuit 206, the ordering of the set of phase clock signals S can also be changed.

Figure 7:
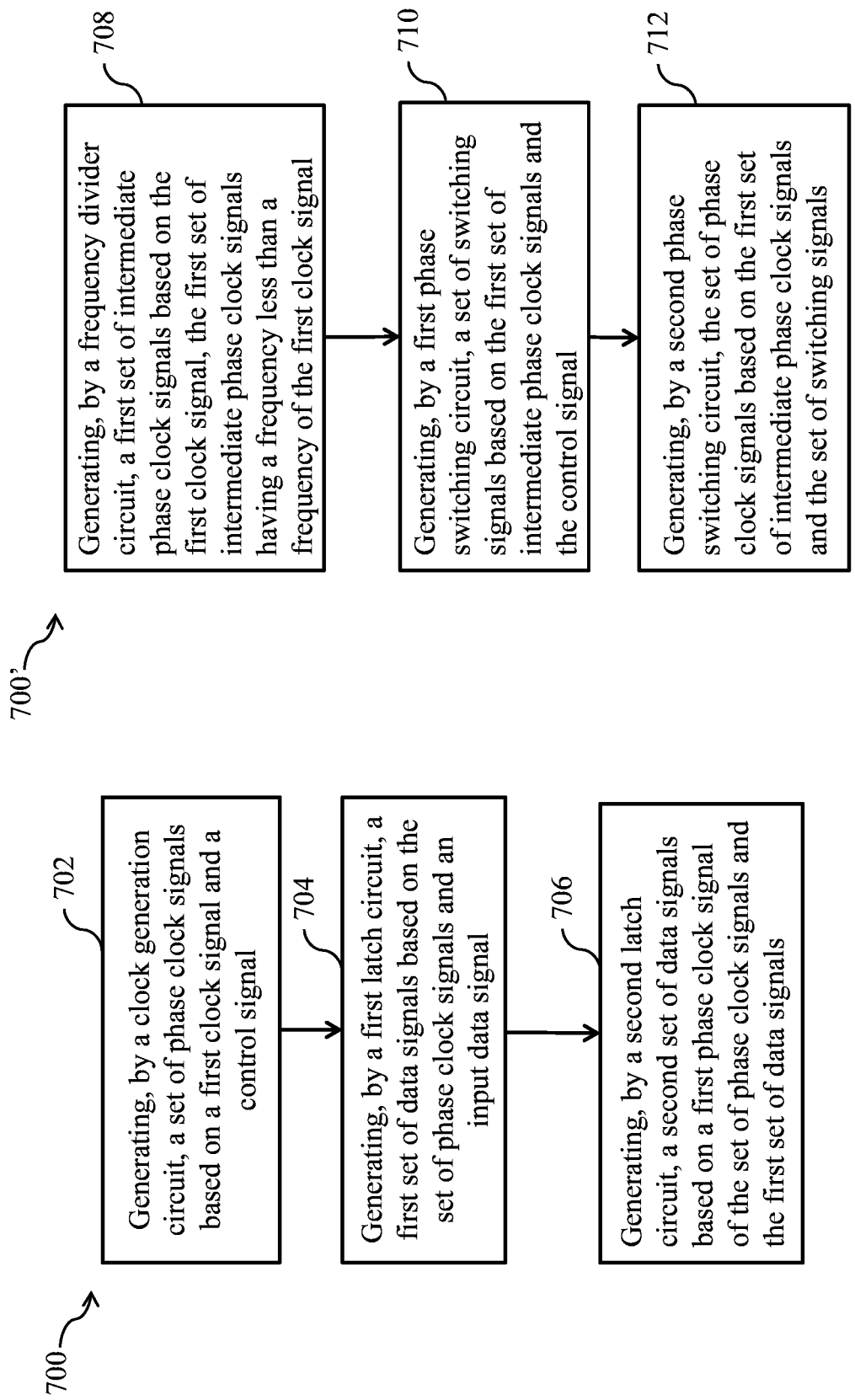
FIG. 7A is a flowchart of a method of operating a de-serializing circuit, such as the de-serialization circuit depicted in FIG. 1, FIG. 2 or FIG. 6, in accordance with some embodiments.
FIG. 7B is a flowchart of a method of operating a clock generating circuit, such as the clock generating circuit depicted in FIG. 1 FIG. 2, or FIG. 6, in accordance with some embodiments.

FIG. 7A is a flowchart of a method 700A of operating a de-serializing circuit, such as the de-serialization circuit depicted in FIG. 1A, FIG. 2 or FIG. 6, in accordance with some embodiments. It is understood that additional operations may be performed before, during, and/or after the method 700 depicted in FIG. 7A, and that some other processes may only be briefly described herein.

Method 700 begins with operation 702, where a set of phase clock signals (e.g., set of phase clock signals P, P' (FIG. 1A, FIG. 2 or FIG. 6)) are generated by a clock generation circuit (e.g., clock generation circuit 102, 200 or 602) based on a first clock signal (e.g., first clock signal DQS) and a control signal (e.g., control signal VALID). Each phase clock signal (e.g., phase clock signals P0, P1, P2, P3 or phase clock signals P0', P1', P2', P3') of the set of phase clock signals (e.g., set of phase clock signals P, P') are offset from adjacent phase clock signals of the set of phase clock signals by a phase value.

In some embodiments, operation 702 further includes generating a second set of phase clock signals (e.g., second set of phase clock signals D8_P0, D8_P1 (FIG. 6)) by a second clock generation circuit (e.g., second clock generation circuit 602) based on a first phase clock signal (e.g., first phase clock signal P0) of the first set of phase clock signals (e.g., first set of phase clock signals P). In these embodiments, each phase clock signal of the second set of phase clock signals (e.g., second set of phase clock signals D8_P0, D8_P1 (FIG. 6)) being offset from adjacent phase clock signals of the second set of phase clock signals (e.g., second set of phase clock signals D8_P0, D8_P1 (FIG. 6)) by a second phase value.

Method 700 continues with operation 704, where a first set of data signals (e.g., first set of data signals DP) is generated by a first latch circuit (e.g., first latch circuit 104) based on the set of phase clock signals (e.g., first set of phase clock signals P, P') and an input data signal (e.g., input data signal DQ, DQ1, DQ1').

Method 700 continues with operation 706, where a second set of data signals (e.g., second set of data signals DS) is generated by a second latch circuit (e.g., second latch circuit 106) based on a first phase clock signal (e.g., first phase clock signal P0) of the set of phase clock signals (e.g., set of phase clock signals P) and the first set of data signals (e.g., first set of data signals DP). Each signal of the second set of data signals (e.g., second set of data signals DS) is aligned with each other. In some embodiments, a leading edge of each signal of the second set of data signals (e.g., second set of data signals DS) is aligned with each other. In some embodiments, a trailing edge of each signal of the second set of data signals (e.g., second set of data signals DS) is aligned with each other. The second set of data signals (e.g., second set of data signals DS) is a parallel stream of data and the input data signal (e.g., input data signal DQ) is a serial stream of data, wherein the first clock signal (e.g., first clock signal DQS) is non-continuous.

FIG. 7B is a flowchart of a method 700' of operating a clock generating circuit, such as the clock generating circuit depicted in FIG. 1A, FIG. 2 or FIG. 6, in accordance with some embodiments. It is understood that additional operations may be performed before, during, and/or after the method 700' depicted in FIG. 7B, and that some other processes may only be briefly described herein. Method 700' is an embodiment of operation 702 of FIG. 7A with similar elements.

Method 700' begins with operation 708, where a first set of intermediate phase clock signals (e.g., first set of intermediate phase clock signals D4) are generated by a frequency divider circuit (e.g., frequency divider circuit 202, 300, 602) based on the first clock signal (e.g., first clock signal DQS). In some embodiments, the first set of intermediate phase clock signals (e.g., first set of intermediate phase clock signals D4) have a frequency ($F_{DIV}$) less than a frequency (e.g., frequency $F_{DQS}$) of the first clock signal (e.g., first clock signal DQS).

Method 700' continues with operation 710, where a set of switching signals (e.g., set of switching signals SS) are generated by a first phase switching circuit (e.g., first phase switching circuit 204) based on the first set of intermediate phase clock signals (e.g., first set of intermediate phase clock signals D4) and the control signal (e.g., control signal VALID).

Method 700' continues with operation 712, where the set of phase clock signals (e.g., set of phase clock signals P) are generated by a second phase switching circuit (e.g., second phase switching circuit 206) based on the first set of intermediate phase clock signals (e.g., first set of intermediate phase clock signals D4) and the set of switching signals (e.g., set of switching signals SS).

Figure 8:
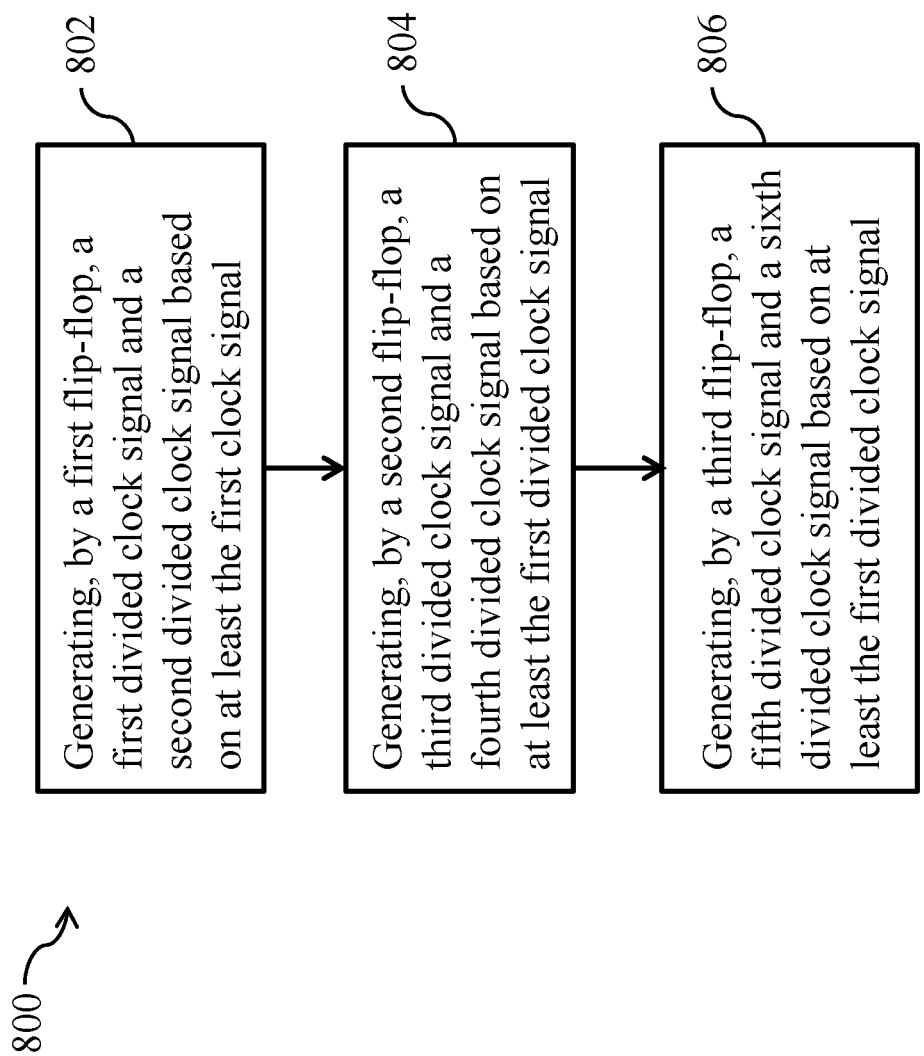
FIG. 8 is a flowchart of a method of operating a frequency divider circuit, such as the frequency divider circuit depicted in FIG. 2, FIG. 3 or FIG. 6, in accordance with some embodiments.

FIG. 8 is a flowchart of a method 800 of operating a frequency divider circuit, such as the frequency divider circuit depicted in FIG. 2, FIG. 3 or FIG. 6, in accordance with some embodiments. It is understood that additional operations may be performed before, during, and/or after the method 800 depicted in FIG. 8, and that some other processes may only be briefly described herein. Method 800 is an embodiment of operation 708 of FIG. 7B with similar elements.

Method 800 begins with operation 802, where first divided clock signal (e.g., first divided clock signal D2_P (FIG. 3)) and a second divided clock signal (e.g., second divided clock signal D2_N) are generated by a first flip-flop (e.g., first flip-flop 302) based on at least the first clock signal (e.g., first clock signal DQS).

Method 800 continues with operation 804, where a third divided clock signal (e.g., third divided clock signal D4_0) and a fourth divided clock signal (e.g., third divided clock signal D4_180) are generated by a second flip-flop (e.g., second flip-flop 304) based on at least the first divided clock signal (e.g., first divided clock signal D2_P).

Method 800 continues with operation 806, where a fifth divided clock signal (e.g., fifth divided clock signal D4_90) and a sixth divided clock signal (e.g., sixth divided clock signal D4_270) are generated by a third flip-flop (e.g., third flip-flop 306) based on at least the second divided clock signal (e.g., first divided clock signal D2_N).

Figure 9:
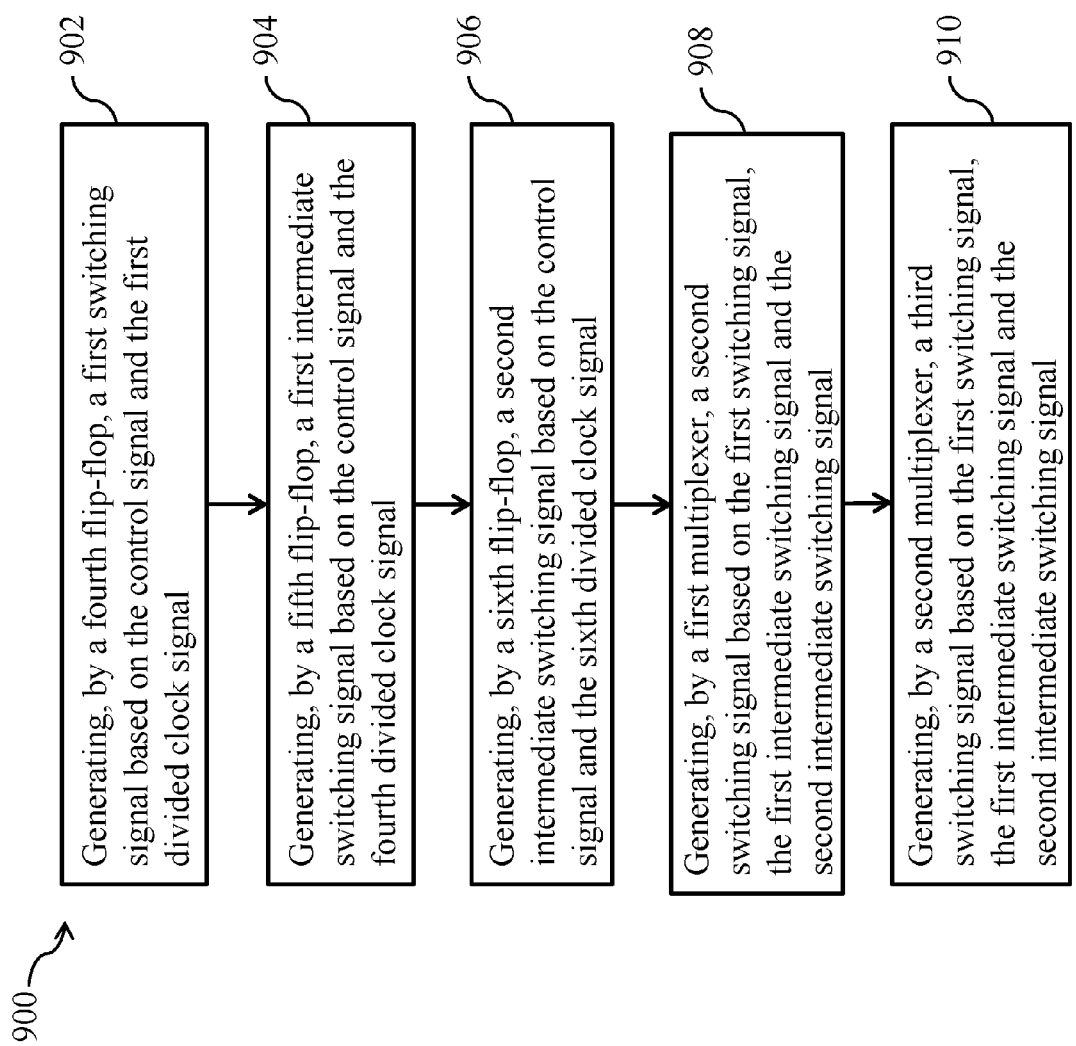
FIG. 9 is a flowchart of a method of operating a first phase switching circuit, such as the first phase switching circuit depicted in FIG. 2, FIG. 4 or FIG. 6, in accordance with some embodiments.

FIG. 9 is a flowchart of a method 900 of operating a first phase switching circuit, such as the first phase switching circuit depicted in FIG. 2, FIG. 4 or FIG. 6, in accordance with some embodiments. It is understood that additional operations may be performed before, during, and/or after the method 900 depicted in FIG. 9, and that some other processes may only be briefly described herein. Method 900 is an embodiment of operation 710 of FIG. 7B with similar elements.

Method 900 begins with operation 902, where a first switching signal (e.g., first switching signal S0 (FIG. 4)) is generated by a fourth flip-flop (e.g., fourth flip-flop 402) based on the control signal (e.g., control signal VALID) and the first divided clock signal (e.g., first divided clock signal D2_P).

Method 900 continues with operation 904, where a first intermediate switching signal (e.g., first intermediate switching signal S1_180) is generated by a fifth flip-flop (e.g., fifth flip-flop 404) based on the control signal (e.g., control signal VALID) and the fourth divided clock signal (e.g., fourth divided clock signal D4_180).

Method 900 continues with operation 906, where a second intermediate switching signal (e.g., second intermediate switching signal S1_270) is generated by a sixth flip-flop (e.g., sixth flip-flop 406) based on the control signal (e.g., control signal VALID) and the sixth divided clock signal (e.g., sixth divided clock signal D4_270).

Method 900 continues with operation 908, where a second switching signal (e.g., first switching signal S1A) is generated by a first multiplexer (e.g., first multiplexer 408) based on the first switching signal (e.g., first switching signal S0), the first intermediate switching signal (e.g., first intermediate switching signal S1_180) and the second intermediate switching signal (e.g., second intermediate switching signal S1_270).

Method 900 continues with operation 910, where a third switching signal (e.g., first switching signal S1B) is generated by a second multiplexer (e.g., second multiplexer 410) based on the first switching signal (e.g., first switching signal S0), the first intermediate switching signal (e.g., first intermediate switching signal S1_180) and the second intermediate switching signal (e.g., second intermediate switching signal S1_270). In some embodiments, the first switching signal (e.g., first switching signal S0), the second switching signal (e.g., second switching signal S1A) and the third switching signal (e.g., third switching signal S1B) belong to the set of switching signals (e.g., set of switching signals SS).

Figure 10:
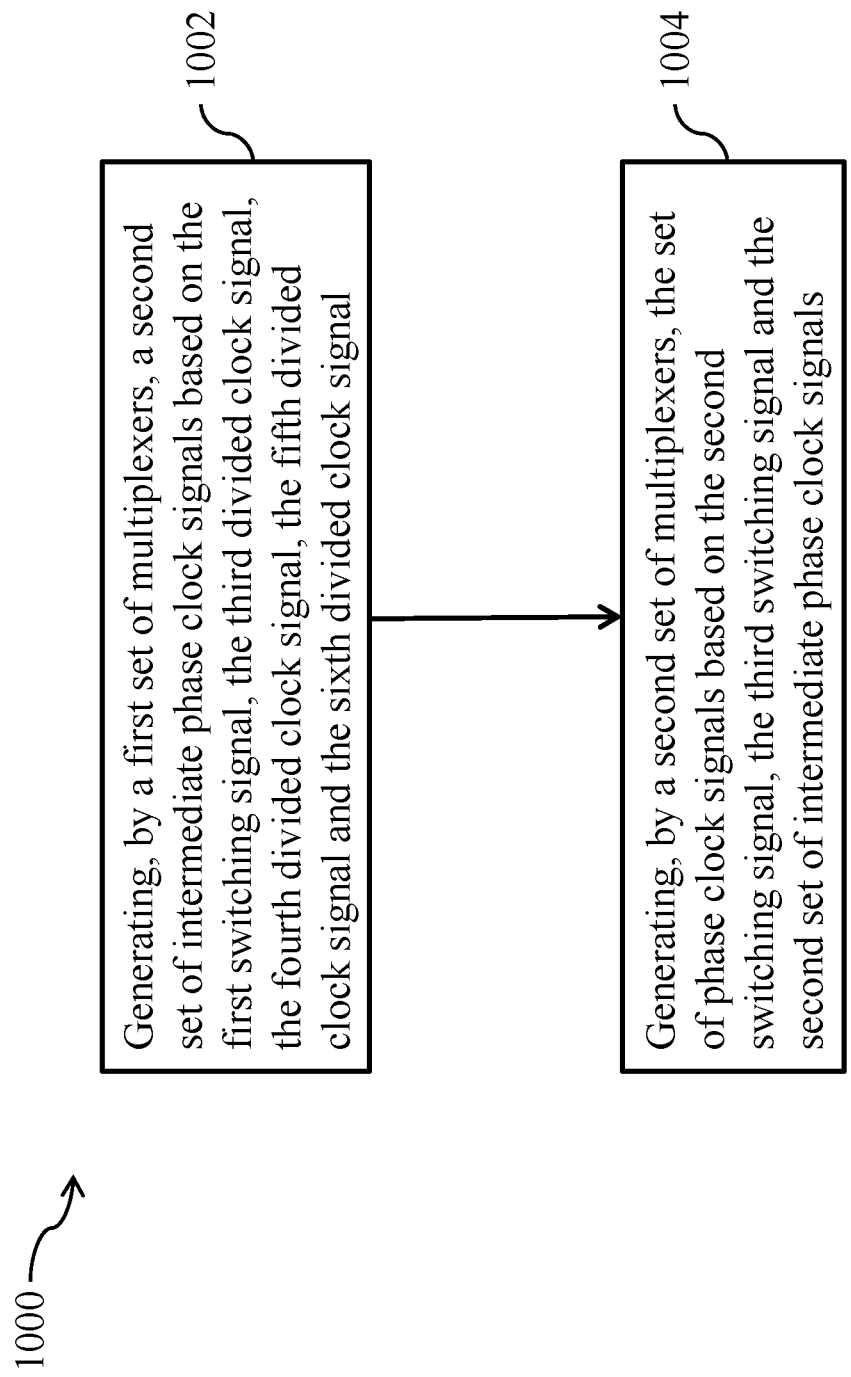
FIG. 10 is a flowchart of a method of operating a second phase switching circuit, such as the second phase switching circuit depicted in FIG. 2, FIG. 5 or FIG. 6, in accordance with some embodiments.

FIG. 10 is a flowchart of a method 1000 of operating a second phase switching circuit, such as the second phase switching circuit depicted in FIG. 2, FIG. 5 or FIG. 6, in accordance with some embodiments. It is understood that additional operations may be performed before, during, and/or after the method 1000 depicted in FIG. 10, and that some other processes may only be briefly described herein. Method 1000 is an embodiment of operation 712 of FIG. 7B with similar elements.

Method 1000 begins with operation 1002, where a second set of intermediate phase clock signals (e.g., second set of intermediate phase clock signals D5 (FIG. 5)) are generated by a first set of multiplexers (e.g., first set of multiplexers 502) based on the first switching signal (e.g., first switching signal S0), the third divided clock signal (e.g., third divided clock signal D4_0), the fourth divided clock signal (e.g., third divided clock signal D4_180), the fifth divided clock signal (e.g., fifth divided clock signal D4_90) and the sixth divided clock signal (e.g., sixth divided clock signal D4_270). In some embodiments, operation 1002 includes each multiplexer (e.g., first multiplexer 510, second multiplexer 512, third multiplexer 514 or fourth multiplexer 516 (FIG. 5)) of the first set of multiplexers (e.g., first set of multiplexers 502) being configured to receive a pair of signals (e.g., two signals from the group consisting of third divided clock signal D4_0, fourth divided clock signal D4_180, fifth divided clock signal D4_90 or sixth divided clock signal D4_270) that are 90 degrees offset from each other, and to generate the second set of intermediate phase clock signals (e.g., second set of intermediate phase clock signals D5_A, D5_B, D5_C or D5_D) of the pair of signals based on the first switching signal (e.g., first switching signal S0).

Method 1000 continues with operation 1004, where the set of phase clock signals (e.g., set of phase clock signals P) are generated by a second set of multiplexers (e.g., second set of multiplexers 504) based on the second switching signal (e.g., second switching signal S1A), the third switching signal (e.g., third switching signal S1B) and the second set of intermediate phase clock signals (e.g., second set of intermediate phase clock signals D5). In some embodiments, the third divided clock signal (e.g., third divided clock signal D4_0), the fourth divided clock signal (e.g., third divided clock signal D4_180), the fifth divided clock signal (e.g., fifth divided clock signal D4_90) and the sixth divided clock signal (e.g., sixth divided clock signal D4_270) belong to the set of phase clock signals (e.g., set of phase clock signals P). In some embodiments, operation 1002 includes each multiplexer (e.g., fifth multiplexer 520, sixth multiplexer 522, seventh multiplexer 524 and eighth multiplexer 526) of the second set of multiplexers (e.g., second set of multiplexers 504) being configured to receive a pair of signals (e.g., two signals from the group consisting of first intermediate phase clock signal D5_A, second intermediate phase clock signal D5_B, third intermediate phase clock signal D5_C, or fourth intermediate phase clock signal D5_D) that are 180 degrees offset from each other, and to generate the set of phase clock signals (e.g., set of phase clock signals P) based on the second switching signal (e.g., second switching signal S1A) or the third switching signal (e.g., third switching signal S1B).

In some embodiments, operation 1002 includes generating a first intermediate phase clock signal (e.g., first intermediate phase clock signal D5_A (FIG. 5)) of the second set of intermediate phase clock signals (e.g., second set of intermediate phase clock signals D5) by a first multiplexer (e.g., first multiplexer 510) based on the first switching signal (e.g., first switching signal S0), the third divided clock signal (e.g., third divided clock signal D4_0) and the fifth divided clock signal (e.g., fifth divided clock signal D4_90).

In some embodiments, operation 1002 includes generating a second intermediate phase clock signal (e.g., second intermediate phase clock signal D5_B (FIG. 5)) of the second set of intermediate phase clock signals (e.g., second set of intermediate phase clock signals D5) by a second multiplexer (e.g., second multiplexer 512) based on the first switching signal (e.g., first switching signal S0), the fourth divided clock signal (e.g., fourth divided clock signal D4_180) and the sixth divided clock signal (e.g., sixth divided clock signal D4_270).

In some embodiments, operation 1002 includes generating a third intermediate phase clock signal (e.g., third intermediate phase clock signal D5_C (FIG. 5)) of the second set of intermediate phase clock signals (e.g., second set of intermediate phase clock signals D5) by a third multiplexer (e.g., third multiplexer 514) based on the first switching signal (e.g., first switching signal S0), the third divided clock signal (e.g., third divided clock signal D4_0) and the fifth divided clock signal (e.g., fifth divided clock signal D4_90).

In some embodiments, operation 1002 includes generating a fourth intermediate phase clock signal (e.g., fourth intermediate phase clock signal D5_D (FIG. 5)) of the second set of intermediate phase clock signals (e.g., second set of intermediate phase clock signals D5) by a fourth multiplexer (e.g., fourth multiplexer 516) based on the first switching signal (e.g., first switching signal S0), the fourth divided clock signal (e.g., fourth divided clock signal D4_180) and the sixth divided clock signal (e.g., sixth divided clock signal D4_270).

In some embodiments, operation 1004 includes generating a fourth phase clock signal (e.g., fourth phase clock signal P3) of the set of phase clock signals (e.g., set of phase clock signals P) by a fifth multiplexer (e.g., fifth multiplexer 520) based on the third switching signal (e.g., third switching signal S1B), the first intermediate phase clock signal (e.g., first intermediate phase clock signal D5_A) of the second set of intermediate phase clock signals (e.g., second set of intermediate phase clock signals D5) and the second intermediate phase clock signal (e.g., second intermediate phase clock signal D5_B) of the second set of intermediate phase clock signals (e.g., second set of intermediate phase clock signals D5).

In some embodiments, operation 1004 includes generating a second phase clock signal (e.g., second phase clock signal P1) of the set of phase clock signals (e.g., set of phase clock signals P) by a sixth multiplexer (e.g., sixth multiplexer 522) based on the third switching signal (e.g., third switching signal S1B), the first intermediate phase clock signal (e.g., first intermediate phase clock signal D5_A) of the second set of intermediate phase clock signals (e.g., second set of intermediate phase clock signals D5) and the second intermediate phase clock signal (e.g., second intermediate phase clock signal D5_B) of the second set of intermediate phase clock signals (e.g., second set of intermediate phase clock signals D5).

In some embodiments, operation 1004 includes generating a third phase clock signal (e.g., third phase clock signal P2) of the set of phase clock signals (e.g., set of phase clock signals P) by a seventh multiplexer (e.g., seventh multiplexer 524) based on the second switching signal (e.g., second switching signal S1A), the third intermediate phase clock signal (e.g., third intermediate phase clock signal D5_C) of the second set of intermediate phase clock signals (e.g., second set of intermediate phase clock signals D5) and the fourth intermediate phase clock signal (e.g., fourth intermediate phase clock signal D5_D) of the second set of intermediate phase clock signals (e.g., second set of intermediate phase clock signals D5).

In some embodiments, operation 1004 includes generating a first phase clock signal (e.g., first phase clock signal P0) of the set of phase clock signals (e.g., set of phase clock signals P) by an eighth multiplexer (e.g., eighth multiplexer 526) based on the second switching signal (e.g., second switching signal S1A), the third intermediate phase clock signal (e.g., third intermediate phase clock signal D5_C) of the second set of intermediate phase clock signals (e.g., second set of intermediate phase clock signals D5) and the fourth intermediate phase clock signal (e.g., fourth intermediate phase clock signal D5_D) of the second set of intermediate phase clock signals (e.g., second set of intermediate phase clock signals D5).

By using method 700 (FIG. 7A), method 700' (FIG. 7B), method 800 (FIG. 8), method 900 (FIG. 9) or method 1000 (FIG. 10), a serial data stream is converted to a parallel data stream by a de-serialization circuit that consumes less power and with less latency than other approaches.

One aspect of this description relates to a de-serialization circuit. The de-serialization circuit includes a clock generation circuit, a first latch circuit and a second latch circuit. The clock generation circuit is configured to generate a set of phase clock signals based on a first clock signal and a control signal, each phase clock signal of the set of phase clock signals being offset from adjacent phase clock signals of the set of phase clock signals by a phase value. The first latch circuit is configured to generate a first set of data signals based on the set of phase clock signals and an input data signal. The second latch circuit is configured to generate a second set of data signals based on a first phase clock signal of the set of phase clock signals and the first set of data signals. Each signal of the second set of data signals being aligned with each other, wherein the first clock signal is non-continuous.

Another aspect of this description relates to a de-serialization circuit. The de-serialization circuit includes a first clock generation circuit, a second clock generation circuit, a first latch circuit, a second latch circuit, a third latch circuit and a fourth latch circuit. The first clock generation circuit is configured to generate a first set of phase clock signals based on a first clock signal and a control signal; each phase clock signal of the first set of phase clock signals being offset from adjacent phase clock signals of the first set of phase clock signals by a first phase value. The second clock generation circuit is configured to generate a second set of phase clock signals based on a first phase clock signal of the first set of phase clock signals; each phase clock signal of the second set of phase clock signals being offset from adjacent phase clock signals of the second set of phase clock signals by a second phase value. The first latch circuit is configured to generate a first set of data signals based on the first set of phase clock signals and an input data signal. The second latch circuit is configured to generate a second set of data signals based on the first phase clock signal of the first set of phase clock signals and the first set of data signals; each signal of the second set of data signals being aligned with each other. The third latch circuit is configured to generate a third set of data signals based on a first phase clock signal of the second set of phase clock signals and the second set of data signals. The fourth latch circuit is configured to generate a fourth set of data signals based on the first phase clock signal of the second set of phase clock signals and the second set of data signals; each signal of the third set of data signals and each signal of the fourth set of data signals being aligned with each other, wherein the first clock signal is non-continuous.

Still another aspect of this description relates to a method of operating a de-serializing circuit. The method includes generating, by a clock generation circuit, a set of phase clock signals based on a first clock signal and a control signal; each phase clock signal of the set of phase clock signals being offset from adjacent phase clock signals of the set of phase clock signals by a phase value. The method further includes generating, by a first latch circuit, a first set of data signals based on the set of phase clock signals and an input data signal. The method further includes generating, by a second latch circuit, a second set of data signals based on a first phase clock signal of the set of phase clock signals and the first set of data signals; each signal of the second set of data signals being aligned with each other, the second set of data signals being a parallel stream of data and the input data signal being a serial stream of data, wherein the first clock signal is non-continuous.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A de-serialization circuit, comprising:
 a clock generation circuit configured to generate a set of phase clock signals based on a first clock signal and a control signal, each phase clock signal of the set of phase clock signals being offset from adjacent phase clock signals of the set of phase clock signals by a phase value;
 a first latch circuit configured to generate a first set of data signals based on the set of phase clock signals and an input data signal; and
 a second latch circuit configured to generate a second set of data signals based on a first phase clock signal of the set of phase clock signals and the first set of data signals, each signal of the second set of data signals being aligned with each other, wherein the first clock signal is non-continuous.

2. The de-serialization circuit of claim 1, wherein
 the input data signal is a data sequence having a plurality of entries;
 each signal of the first set of data signals corresponds to each phase clock signal of the set of phase clock signals and each entry of the plurality of entries of the input data signal;
 each signal of the second set of data signals corresponds to each signal of the first set of data signals; and
 a period of each signal of the set of phase clock signals is greater than a period of the input data signal.

3. The de-serialization circuit of claim 1, wherein
 the first latch circuit comprises:
  a first set of flip-flops;
  each flip-flop of the first set of flip-flops has:
   a first input terminal configured to receive the input data signal;
   a second input terminal configured to receive a corresponding phase clock signal of the set of phase clock signals; and
   an output terminal configured to output a corresponding signal of the first set of data signals; and
 the second latch circuit comprises:
  a second set of flip-flops;
  each flip-flop of the second set of flip-flops corresponds to each flip-flop of the first set of flip-flops;
  each flip-flop of the second set of flip-flops has:
   a third input terminal configured to receive the first phase clock signal of the set of phase clock signals;
   a fourth input terminal coupled to the corresponding first output terminal of each flip-flop of the first set of flip-flops;
   wherein the fourth input terminal of each flip-flop of the second set of flip-flops is configured to receive the corresponding signal of the first set of data signals; and
   a second output terminal configured to output a corresponding signal of the second set of data signals.

4. The de-serialization circuit of claim 1, wherein the clock generation circuit comprises:
 a frequency divider circuit configured to receive the first clock signal, and to generate a first set of intermediate phase clock signals having a frequency less than a frequency of the first clock signal;
 a first phase switching circuit configured to receive the first set of intermediate phase clock signals and the control signal, and to generate a set of switching signals; and
 a second phase switching circuit configured to receive the first set of intermediate phase clock signals and the set of switching signals, and to generate the set of phase clock signals.

5. The de-serialization circuit of claim 4, wherein the frequency divider circuit comprises:
 a first flip-flop having a first input terminal, a second input terminal, a first output terminal and a second output terminal, the first input terminal of the first flip-flop being configured to receive the first clock signal, the second input terminal of the first flip-flop being coupled to the second output terminal of the first flip-flop, the first output terminal of the first flip-flop being configured to generate a first divided clock signal, and the second output terminal of the first flip-flop being configured to generate a second divided clock signal;

a second flip-flop having a first input terminal, a second input terminal, a first output terminal and a second output terminal, the first input terminal of the second flip-flop being coupled to the first output terminal of the first flip-flop, the first input terminal of the second flip-flop being configured to receive the first divided clock signal, the second input terminal of the second flip-flop being coupled to the second output terminal of the second flip-flop, the first output terminal of the second flip-flop being configured to generate a third divided clock signal, and the second output terminal of the second flip-flop being configured to generate a fourth divided clock signal; and a third flip-flop having a first input terminal, a second input terminal, a first output terminal and a second output terminal, the first input terminal of the third flip-flop being coupled to the second output terminal of the first flip-flop, the first input terminal of the third flip-flop being configured to receive the second divided clock signal, the second input terminal of the third flip-flop being coupled to the second output terminal of the third flip-flop, the first output terminal of the third flip-flop being configured to generate a fifth divided clock signal, and the second output terminal of the third flip-flop being configured to generate a sixth divided clock signal, wherein the third divided clock signal, the fourth divided clock signal, the fifth divided clock signal and the sixth divided clock signal belong to the first set of intermediate phase clock signals.

6. The de-serialization circuit of claim 5, wherein the first phase switching circuit comprises:

a fourth flip-flop having a first input terminal, a second input terminal, a first output terminal and a second output terminal, the first input terminal of the fourth flip-flop being configured to receive the control signal, the second input terminal of the fourth flip-flop being coupled to the first output terminal of the first flip-flop, the second input terminal of the fourth flip-flop being configured to receive the first divided clock signal, and the first output terminal of the fourth flip-flop being configured to generate a first switching signal;

a fifth flip-flop having a first input terminal, a second input terminal, a first output terminal and a second output terminal, the first input terminal of the fifth flip-flop being configured to receive the control signal, the second input terminal of the fifth flip-flop being coupled to the second output terminal of the second flip-flop, the second input terminal of the fifth flip-flop being configured to receive the fourth divided clock signal, and the first output terminal of the fifth flip-flop being configured to generate a first intermediate switching signal; and a sixth flip-flop having a first input terminal, a second input terminal, a first output terminal and a second output terminal, the first input terminal of the sixth flip-flop being configured to receive the control signal, the second input terminal of the sixth flip-flop being coupled to the second output terminal of the third flip-flop, the second input terminal of the sixth flip-flop being configured to receive the sixth divided clock signal, and the first output terminal of the sixth flip-flop being configured to generate a second intermediate switching signal.

7. The de-serialization circuit of claim 6, wherein the first phase switching circuit further comprises:

a first multiplexer having a first input terminal, a second input terminal, a third input terminal and a first output terminal, the first input terminal of the first multiplexer being coupled to the first output terminal of the fourth flip-flop, the first input terminal of the first multiplexer being configured to receive the first switching signal, the second input terminal of the first multiplexer being coupled to the first output terminal of the sixth flip-flop, the second input terminal of the first multiplexer being configured to receive the second intermediate switching signal, the third input terminal of the first multiplexer being coupled to the first output terminal of the fifth flip-flop, the third input terminal of the first multiplexer being configured to receive the first intermediate switching signal, and the first output terminal of the first multiplexer being configured to generate a second switching signal; and a second multiplexer having a first input terminal, a second input terminal, a third input terminal and a first output terminal, the first input terminal of the second multiplexer being coupled to the first output terminal of the fourth flip-flop, the first input terminal of the second multiplexer being configured to receive the first switching signal, the second input terminal of the second multiplexer being coupled to the first output terminal of the fifth flip-flop, the second input terminal of the second multiplexer being configured to receive the first intermediate switching signal, the third input terminal of the second multiplexer being coupled to the first output terminal of the sixth flip-flop, the third input terminal of the second multiplexer being configured to receive the second intermediate switching signal, and the first output terminal of the second multiplexer being configured to generate a third switching signal, wherein the first switching signal, the second switching signal and the third switching signal belong to the set of switching signals.

8. The de-serialization circuit of claim 7, wherein the second phase switching circuit further comprises:

a first set of multiplexers being configured to output the third divided clock signal, the fourth divided clock signal, the fifth divided clock signal and the sixth divided clock signal based on the first switching signal; and a second set of multiplexers being configured to output the third divided clock signal, the fourth divided clock signal, the fifth divided clock signal and the sixth divided clock signal based on the second switching signal and the third switching signal, wherein the third divided clock signal, the fourth divided clock signal, the fifth divided clock signal and the sixth divided clock signal belong to the set of phase clock signals.

9. A de-serialization circuit, comprising:

a first clock generation circuit configured to generate a first set of phase clock signals based on a first clock signal and a control signal, each phase clock signal of the first set of phase clock signals being offset from adjacent phase clock signals of the first set of phase clock signals by a first phase value;

a second clock generation circuit configured to generate a second set of phase clock signals based on a first phase clock signal of the first set of phase clock signals, each phase clock signal of the second set of phase clock signals being offset from adjacent phase clock signals of the second set of phase clock signals by a second phase value;

a first latch circuit configured to generate a first set of data signals based on the first set of phase clock signals and an input data signal;

a second latch circuit configured to generate a second set of data signals based on the first phase clock signal of the first set of phase clock signals and the first set of data signals, each signal of the second set of data signals being aligned with each other;

a third latch circuit configured to generate a third set of data signals based on a first phase clock signal of the second set of phase clock signals and the second set of data signals; and a fourth latch circuit configured to generate a fourth set of data signals based on the first phase clock signal of the second set of phase clock signals and the second set of data signals, each signal of the third set of data signals and each signal of the fourth set of data signals being aligned with each other, wherein the first clock signal is non-continuous.

10. The de-serialization circuit of claim 9, wherein the input data signal has a plurality of entries;

each signal of the first set of data signals corresponds to each phase clock signal of the first set of phase clock signals;

each signal of the first set of data signals and each phase clock signal of the first set of phase clock signals corresponds to two entries of the plurality of entries of the input data signal;

each signal of the second set of data signals corresponds to each signal of the third set of data signals and each signal of the fourth set of data signals;

a period of each signal of the first set of phase clock signals is greater than a period of the input data signal; and a period of each signal of the second set of phase clock signals is greater than the period of each signal of the first set of phase clock signals.

11. The de-serialization circuit of claim 9, wherein the first latch circuit comprises:
  a first set of flip-flops;
  each flip-flop of the first set of flip-flops has:
    a first input terminal configured to receive the input data signal;
    a second input terminal configured to receive a corresponding phase clock signal of the first set of phase clock signals; and
    a first output terminal configured to output a corresponding signal of the first set of data signals; and
the second latch circuit comprises:
  a second set of flip-flops;
  each flip-flop of the second set of flip-flops corresponds to each flip-flop of the first set of flip-flops;
  each flip-flop of the second set of flip-flops has:
    a third input terminal configured to receive the first phase clock signal of the first set of phase clock signals;
    a fourth input terminal coupled to the corresponding first output terminal of each flip-flop of the first set of flip-flops, the fourth input terminal of each flip-flop of the second set of flip-flops is configured to receive the corresponding signal of the first set of data signals; and
    a second output terminal configured to output a corresponding signal of the second set of data signals.

12. The de-serialization circuit of claim 10, wherein the third latch circuit comprises:
  a first set of flip-flops;
  each flip-flop of the first set of flip-flops has:
    a first input terminal configured to receive a corresponding signal of the second set of data signals;
    a second input terminal configured to receive the first phase clock signal of the second set of phase clock signals; and
    a first output terminal configured to output a corresponding signal of a first intermediate set of data signals; and
  a second set of flip-flops;
  each flip-flop of the second set of flip-flops corresponds to each flip-flop of the first set of flip-flops;
  each flip-flop of the second set of flip-flops has:
    a third input terminal configured to receive the first phase clock signal of the second set of phase clock signals;
    a fourth input terminal coupled to the corresponding first output terminal of each flip-flop of the first set of flip-flops, the fourth input terminal of each flip-flop of the second set of flip-flops is configured to receive the corresponding signal of the first intermediate set of data signals; and
    a second output terminal configured to output a corresponding signal of the third set of data signals.

13. The de-serialization circuit of claim 12, wherein the fourth latch circuit comprises:
  a third set of flip-flops;
  each flip-flop of the third set of flip-flops has:
    a fifth input terminal configured to receive a corresponding signal of the second set of data signals;
    a sixth input terminal configured to receive the first phase clock signal of the second set of phase clock signals; and
    a third output terminal configured to output a corresponding signal of a second intermediate set of data signals; and
  a fourth set of flip-flops;
  each flip-flop of the fourth set of flip-flops corresponds to each flip-flop of the third set of flip-flops;
  each flip-flop of the fourth set of flip-flops has:
    a seventh input terminal configured to receive the first phase clock signal of the second set of phase clock signals;
    an eighth input terminal coupled to the corresponding third output terminal of each flip-flop of the third set of flip-flops, the eighth input terminal of each flip-flop of the fourth set of flip-flops is configured to receive the corresponding signal of the second intermediate set of data signals; and
    a fourth output terminal configured to output a corresponding signal of the fourth set of data signals,
  wherein the third set of flip-flops are negative edge-triggered, and the first set of flip-flops, the second set of flip-flops and the fourth set of flip-flops are positive edge-triggered.

14. The de-serialization circuit of claim 9, wherein the first clock generation circuit comprises:
  a first frequency divider circuit configured to receive the first clock signal, and to generate a first set of intermediate phase clock signals having a frequency less than a frequency of the first clock signal;

a first phase switching circuit configured to receive the first set of intermediate phase clock signals and the control signal, and to generate a set of switching signals; and a second phase switching circuit configured to receive the first set of intermediate phase clock signals and the set of switching signals, and to generate the first set of phase clock signals.

15. The de-serialization circuit of claim 14, wherein the second clock generation circuit comprises a second frequency divider circuit configured to receive the first phase clock signal of the first set of phase clock signals, and to generate the first phase clock signal of the second set of phase clock signals having a frequency less than a frequency of the first phase clock signal of the first set of phase clock signals; and the second frequency divider circuit comprises a first flip-flop having a first input terminal, a second input terminal, a first output terminal and a second output terminal, the first input terminal of the first flip-flop being configured to receive the first phase clock signal of the first set of phase clock signals, the second input terminal of the first flip-flop being coupled to the second output terminal of the first flip-flop, the first output terminal of the first flip-flop being configured to generate the first phase clock signal of the second set of phase clock signals, and the second output terminal of the first flip-flop being configured to generate an inverted first phase clock signal of the second set of phase clock signals.

16. A method of operating a de-serializing circuit, the method comprising:

generating, by a clock generation circuit, a set of phase clock signals based on a first clock signal and a control signal, each phase clock signal of the set of phase clock signals being offset from adjacent phase clock signals of the set of phase clock signals by a phase value;

generating, by a first latch circuit, a first set of data signals based on the set of phase clock signals and an input data signal; and generating, by a second latch circuit, a second set of data signals based on a first phase clock signal of the set of phase clock signals and the first set of data signals, each signal of the second set of data signals being aligned with each other, the second set of data signals being a parallel stream of data and the input data signal being a serial stream of data, wherein the first clock signal is non-continuous.

17. The method of claim 16, wherein the generating the set of phase clock signals based on the first clock signal and the control signal comprises:

generating, by a frequency divider circuit, a first set of intermediate phase clock signals based on the first clock signal, the first set of intermediate phase clock signals having a frequency less than a frequency of the first clock signal;

generating, by a first phase switching circuit, a set of switching signals based on the first set of intermediate phase clock signals and the control signal; and generating, by a second phase switching circuit, the set of phase clock signals based on the first set of intermediate phase clock signals and the set of switching signals.

18. The method of claim 17, wherein the generating the first set of intermediate phase clock signals comprises:

generating, by a first flip-flop, a first divided clock signal and a second divided clock signal based on at least the first clock signal;

generating, by a second flip-flop, a third divided clock signal and a fourth divided clock signal based on at least the first divided clock signal; and generating, by a third flip-flop, a fifth divided clock signal and a sixth divided clock signal based on at least the second divided clock signal.

19. The method of claim 18, wherein the generating the set of switching signals comprises:

generating, by a fourth flip-flop, a first switching signal based on the control signal and the first divided clock signal;

generating, by a fifth flip-flop, a first intermediate switching signal based on the control signal and the fourth divided clock signal;

generating, by a sixth flip-flop, a second intermediate switching signal based on the control signal and the sixth divided clock signal;

generating, by a first multiplexer, a second switching signal based on the first switching signal, the first intermediate switching signal and the second intermediate switching signal; and generating, by a second multiplexer, a third switching signal based on the first switching signal, the first intermediate switching signal and the second intermediate switching signal, wherein the first switching signal, the second switching signal and the third switching signal belong to the set of switching signals.

20. The method of claim 19, wherein the generating the set of phase clock signals based on the first set of intermediate phase clock signals and the set of switching signals comprises:

generating, by a first set of multiplexers, a second set of intermediate phase clock signals based on the first switching signal, the third divided clock signal, the fourth divided clock signal, the fifth divided clock signal and the sixth divided clock signal; and generating, by a second set of multiplexers, the set of phase clock signals based on the second switching signal, the third switching signal and the second set of intermediate phase clock signals, wherein the third divided clock signal, the fourth divided clock signal, the fifth divided clock signal and the sixth divided clock signal belong to the set of phase clock signals.

* * * * *